(12) United States Patent
Noda et al.

(10) Patent No.: US 7,816,741 B2
(45) Date of Patent: Oct. 19, 2010

(54) SEMICONDUCTOR DEVICE

(75) Inventors: Masaaki Noda, Shiga (JP); Tomonari Oota, Toyama (JP)

(73) Assignee: Panasonic Corporation, Osaka (JP)

( * ) Notice: Subject to any disclaimer, the term of this patent is extended or adjusted under 35 U.S.C. 154(b) by 193 days.

(21) Appl. No.: 12/105,027

(22) Filed: Apr. 17, 2008

(65) Prior Publication Data
US 2008/0265276 A1 Oct. 30, 2008

(30) Foreign Application Priority Data
Apr. 25, 2007 (JP) .............................. 2007-116157

(51) Int. Cl.
H01L 29/72 (2006.01)
(52) U.S. Cl. ...................... 257/370; 257/139; 257/288; 257/331; 257/341
(58) Field of Classification Search .................. 257/139, 257/288, 331, 341, 370
See application file for complete search history.

(56) References Cited

U.S. PATENT DOCUMENTS
2007/0114570 A1* 5/2007 Yamaguchi et al. ......... 257/197

FOREIGN PATENT DOCUMENTS
JP            08-316479          11/1996

* cited by examiner

Primary Examiner—Edward Wojciechowicz
(74) Attorney, Agent, or Firm—McDermott Will & Emery LLP

(57) ABSTRACT

The semiconductor device of the present invention has a body layer of a P-type impurity region formed on an $N^-$ layer of an N-type impurity region. A plurality of trenches is formed through the body layer from the main surface thereof. A gate insulating film and a gate electrode are formed in each trench. A contact layer of a P-type impurity region and an emitter layer of an N-type impurity region are formed on the main surface of the body layer. A plurality of floating ring layers of P-type impurity regions is formed on the main surface of the $N^-$ layer, being spaced apart from the body layer. A well layer of an N-type impurity region is formed between the body layer and $N^-$ layer in an area contained in the body layer in plane view.

18 Claims, 19 Drawing Sheets

SEMICONDUCTOR DEVICE

CROSS-REFERENCE TO RELATED APPLICATION

The present application claims the benefit of patent application number 2007-116157 filed in Japan on Apr. 25, 2007, the subject matter of which is incorporated herein by reference.

BACKGROUND OF THE INVENTION

1. Field of the Invention

The present invention relates to a semiconductor device, and more particularly to a semiconductor device including an insulated gate bipolar transistor.

2. Description of the Related Art

Insulated gate bipolar transistors (IGBTs) are conventionally used for power semiconductor devices. It is a well-known structure wherein an IGBT has trenches filled with gate electrodes on a surface of a substrate.

FIG. 16 is a plane view showing a conventional IGBT structure wherein trenches filled with gate electrodes are provided on the surface of the substrate disclosed in Japanese Laid-Open Patent Application No. H08-316479. FIG. 17 is a cross-sectional view showing the cross-sectional structure at the line X-X in FIG. 16. FIG. 18 is a cross-sectional view showing the cross-sectional structure at the line Y-Y in FIG. 16. FIGS. 16 to 18 are schematic views and the components are not shown in their actual scale ratios.

As shown in FIGS. 17 and 18, a conventional IGBT has an N⁻ layer 106 consisting of a low concentration N-type impurity region formed on a collector layer 112 consisting of a high concentration P-type impurity region via a buffer layer 111 consisting of a high concentration N-type impurity region. A well layer 105 consisting of an N-type impurity region is formed in the surface part of the N⁻ layer 106. A body layer 102 consisting of a P-type impurity region is formed in the surface part of the well layer 105. Multiple trenches 121 are formed through the body layer 102, reaching the well layer 105. Each trench 121 is filled with a gate electrode 108 made of, for example, polysilicon and the like via a gate insulating film 107 formed on the inner surface of the trench 121. As shown in FIGS. 16 to 18, each gate electrode 108 (trench 121) is continuously formed in a specific direction. A collector electrode 113 is provided on the underside of the collector layer 112.

As shown in FIGS. 16 and 17, emitter layers 104 each consisting of a high concentration N-type impurity region is formed where the main surface of the body layer 102 and trenches 121 meet along the trenches 121. Contact layers 101 each consisting of a high concentration P-type impurity region are formed between the emitter layers 104 in the adjacent trenches 121 along the trenches 121. An emitter electrode 114 is provided on the top surfaces of the emitter layers 104 and contact layers 101 and electrically connected both to the emitter layers 104 and to the contact layers 101. Oxide films 109 are interposed between each gate electrode 108 and emitter electrode 114 so that the gate electrode 108 and emitter electrode 114 are electrically insulated. As shown in FIGS. 16 and 18, the gate electrodes 108 are electrically connected to each other via coupling electrodes 115.

On the other hand, as shown in FIGS. 16 to 18, when the IGBT must have high breakdown voltage, a plurality of floating ring layers 103 (103a, 103b, 103c) each consisting of a high concentration P-type impurity region is provided around the body layer 102 in which multiple trenches 121 are formed, being spaced apart from the body layer 102. A channel stopper layer 101 consisting of a high concentration N-type impurity region is provided around the outermost floating ring layer 103c, being spaced apart therefrom.

In the IGBT having the above-described structure, the N-type emitter layer 104, P-type body layer 102 and N-type well layer 105, which are formed along the each trench 121, constitute an N-channel type MOS transistor (see FIG. 17). On the other hand, the P-type contact layer 101, P-type body layer 102, N-type well layer 105, N⁻ layer 106, N-type buffer layer 111, and P-type collector layer 112 constitute a PNP bipolar transistor (see FIG. 17). The IGBT is operated by combined operations of the MOS and the PNP transistors.

For example, in a state that negative potential is applied to the emitter electrode 114 and concurrently positive potential is applied to the collector electrode 113, a positive potential which is larger than that of being applied to the emitter electrode 114, is applied to the each gate electrode 108. In such a case, an inversion layer is formed on the surface of the P-type body layer 102 that is in contact with the gate insulating film 107. Thus, the MOS transistor turns on-state and electron current flows through the MOS transistor. The electron current has a function as base current for the PNP transistor. Namely, when the electron current flows, the PNP transistor turns on-state and hole current flows through the collector electrode 113 and emitter electrode 114.

As described above, in the IGBT, when electron current flows in the MOS transistor, the base current is provided to the PNP transistor and the PNP transistor turns on-state. Therefore, in the IGBT, on-state and off-state of the PNP transistor is switched by switching on-state and off-state of the each MOS transistor by controlling a voltage applied to the each gate electrode 108.

With the above described structure, the well layer 105 forms a potential barrier against holes in the direction from the N⁻ layer 106 to the body layer 102. Namely, the density of holes moving from the collector layer 112 to the body layer 102 in the on-state is increased in the well layer 105, reducing an on-resistance of the IGBT. Therefore, with the provision of the well layer 105, the on-resistance can be lowered for the IGBT having the same chipsize. In other words, with the provision of the well layer 105, the chip can be downsized for the IGBT having the same on-resistance. The well layer 105 can further reduce the on-resistance when it increases the hole density in a larger area, and a well layer 105 is formed to completely surround the entire body layer 102 in the plane view as shown in FIG. 16.

SUMMARY OF THE INVENTION

However, it has been found that the above described well layer 105 lowers the collector-emitter breakdown voltage (BVCES) in the gate-off state.

FIG. 19 is a cross-sectional view schematically showing the potential distribution when a reverse voltage is applied to the collector electrode 113 in the gate-off state. Equipotential lines are shown by broken lines in FIG. 19. As shown in FIG. 19, the equipotential lines run along the contour of the P-type body layer 102 when a reverse voltage is applied to the collector electrode 113 in the gate-off state. The equipotential lines significantly turns along the contour of the body layer 102 around the bottom corner of the body layer 102 (marked by the arrow A in FIG. 19). In such a case, electric field concentration tends to occur around the bottom corner of the body layer 102. Therefore, in the IGBT having the above described structure, breakdown due to electric field concentration initially occurs at the PN junction comprised by the P-type body layer 102 and N-type well layer 105 around the bottom corner of the body layer 102. In other words, the voltage at which breakdown occurs at the PN junction around the bottom corner of the body layer 102 (the PN junction breakdown voltage) determines the collector-emitter breakdown voltage (BVCES) in the gate-off state.

When the PN junction is a one-sided abrupt junction (the N-type region is the one with a low concentration), the PN junction breakdown voltage $V_{BR}$ is expressed by the equation 1 below in which $K_s$ is the silicon relative dielectric constant, $E_{crit}$ is the critical avalanche breakdown electric field, $C_B$ is the N-type region impurity concentration, $\in_0$ is the vacuum dielectric constant, and q is the electron electric charge:

$$V_{BR} = K_s \in_0 E_{crit}^2 / 2qC_B \qquad (1)$$

As shown in the equation 1, the PN junction breakdown voltage $V_{BR}$ is inversely proportional to the N-type region impurity concentration $C_B$. The PN junction breakdown voltage $V_{BR}$ is lowered as the N-type region impurity concentration $C_B$ is increased. The impurity concentration in the well layer 105 is 1.5 times or more higher than the impurity concentration in the N⁻ layer 106 in the IGBT having the above described structure although it is not always so because it depends on the guaranteed breakdown voltage of the collector-emitter breakdown voltage BVCES in the gate-off state. Then, the well layer 105 disadvantageously lowers the collector-emitter breakdown voltage (VCES) while it can reduce the on-resistance of the IGBT.

Furthermore, with the above-described conventional structure, when a reverse voltage is applied to the collector electrode in the gate-off state and the collector voltage $V_C$ is increased, a depletion layer extends through the body layer 102 and well layer 105 from the PN junction comprised by the body layer 102 and well layer 105. When the collector voltage $V_C$ is further increased, the depletion layer having extended through the well layer 105 further extends into the N⁻ layer 106 and reaches the innermost floating ring layer 103a. The floating ring layers 103 each consisting of an impurity regions have a surface impurity concentration of an exponent of 18 or higher so that the floating ring layers 103 have a nearly uniform potential. Then, the depletion layer reached the innermost floating ring layer 103a passes through the floating ring layer 103a and further extends through the N⁻ layer 106 between the floating ring layer 103a and the next floating ring layer 103b. When the collector voltage Vc (the difference in potential between the collector and the emitter) reaches the rated voltage, the edge of the depletion layer reaches near the channel stopper layer 110.

The distance between the body layer 102 and the channel stopper layer 110 (the total width of the N⁻ layer 106) is determined based on the extension of the depletion layer when the rated voltage is applied between the collector and the emitter. In other words, the total width of the N⁻ layer 106 is established so that the edge of the depletion layer reaches near the channel stopper layer 110 when the rated voltage is applied between the collector and the emitter.

When the PN junction is a one-sided abrupt junction (the N-type region is the one with a low concentration), the width W of the depletion layer is expressed by the equation 2 below in which $V_C$ is the voltage applied to the collector:

$$W = (2K_s \in_0 V_C / qC_B)^{1/2} \qquad (2)$$

As shown in the equation 2, the width W of the depletion layer is inversely proportional to the square root of the N-type region impurity concentration $C_B$. Therefore, the width W of the depletion layer is decreased as the N-type region impurity concentration $C_B$ is increased. In the above-described conventional structure, the regions between one floating ring layer and the next are the N⁻ layer 106. For example, when the IGBT has a collector-emitter breakdown voltage of approximately 300 V, the N⁻ layer 106 has an impurity concentration in the order of an exponent of 14.

In the conventional structure, since the N⁻ layer 106 has a low concentration, the extension of the depletion layer through the N⁻ layer 106 is large (see the equation 2). Therefore, the total width of the N⁻ layer 106 between the body layer 102 and the channel stopper layer 110 is increased. For example, when the IGBT has a collector-emitter breakdown voltage (BVCES) of approximately 300 V, the total width of the N⁻ layer 106 from the edge of the body layer 102 to the channel stopper layer 110 has to be approximately 200 µm. For that reason, the chip size is disadvantageously increased in the conventional structure.

As described above, it is difficult in the conventional IGBT to reduce the on-resistance without lowering the collector-emitter breakdown voltage. Furthermore, the chip cannot be downsized when a desired collector-emitter breakdown voltage is realized, The present invention is proposed in view of the above-described prior art circumstances and the purpose of the present invention is to provide a semiconductor device that may reduce the on-resistance without lowering the collector-emitter breakdown voltage and downsize the chip.

In order to resolve the above-described problems, the present invention utilizes the following technical means. Firstly, the present invention is on the premise that a semiconductor device includes an insulated gate bipolar transistor. The semiconductor device according to the present invention comprises a first semiconductor layer consisting of a first conductivity type impurity region. A body layer (a second semiconductor layer) consisting of a second conductivity type impurity region is provided to the first semiconductor layer. A plurality of trench formed regions (trenches) is formed through the body layer from the main surface thereof. A gate insulating films and a gate electrode are formed within the respective trench formed regions. A contact layer consisting of the second conductivity type impurity region and an emitter layer consisting of the first conductivity type impurity region are provided on the main surface of the body layer. On the other hand, a plurality of floating ring layers (third semiconductor layers) each consisting of the second conductivity type impurity region is formed on the main surface of the first semiconductor layer, being spaced apart from the body layer. A well layer (a fourth semiconductor layer) consisting of the first conductively type impurity region is formed between the body layer and the first semiconductor layer in an area contained in the body layer in plane view. A collector layer can be formed, for example, on the opposite side of the first semiconductor layer to the body layer via a buffer layer consisting of a high concentration first conductivity type impurity region.

With the above structure, the well layer serves to reduce the on-resistance of the semiconductor device without lowering the breakdown voltage. The well layer can be formed inside the outermost edge of the plurality of trench formed regions in plane view.

The above semiconductor device can further comprises second well layers (fifth semiconductor layers) each consisting of the first conductivity type impurity region containing the floating ring layer. Such a semiconductor device can further downsize the chip.

For example, the second well layer is individually formed to the each floating ring layers. In this case, each second well layer may be formed spaced apart or overlapped one another.

It is preferable that a pair of the second well layers on both sides of one floating ring layer is disposed in a state that a width of the second well layer on the side away from the body layer is larger than a width of the well layer on the side closer to the body layer in plane view. Furthermore, it is preferable that a width of the second well layer on either side of one floating ring layer is larger than a width of the second well layer on either side of another floating ring layer closer to the body layer in plane view.

The body layer and floating ring layers may be formed in the same process of forming impurity regions at the same time. The well layer and the second well layers may be formed in the same process for forming impurity regions.

The present invention can reduce the on-resistance of an insulated gate bipolar transistor while preventing cut-down in the collector-emitter breakdown voltage. In other words, the collector-emitter breakdown voltage can be improved for the same on-resistance as compared to the conventional structure. The distance between the body layer and the channel stopper layer formed outside the floating ring layers can be reduced for the same on-resistance as compared to the conventional structure, thereby downsizing the chip.

Particularly, the well layer formed in a region contained in the body layer and inside the outermost edge of the plurality of the trench formed regions in plane view serves to further prevent cut-down in the collector-emitter breakdown voltage when the impurity concentration in the well layer is increased. With this structure, the impurity concentration in the well layer can be increased without lowering the collector-emitter breakdown voltage. As a result, the on-resistance can be reduced without lowering the collector-emitter breakdown voltage. The distance between the body layer and the channel stopper layer can be reduced for the same on-resistance as compared to the conventional structure, thereby downsizing the chip.

Further, providing the second well layer containing the floating ring layer allows the distance between the body layer and the channel stopper layer can further be reduced. In other words, the chip can further be downsized. In such a case, the distance between the body layer and the channel stopper layer can be reduced when a pair of the second well layers on both sides of the floating ring layer is disposed in a state that the width of the second well layer on the side away from the body layer is larger than the width of the second well layer on the side closer to the body layer in plane view. Furthermore, the distance between the body layer and the channel stopper layer can further be reduced when the width of the second well layer on either side of one floating ring layer is larger than the width of the second well layer on the either side of another floating ring layer closer to the body layer in plane view.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Embodiments of the present invention are described in detail hereafter with reference to the drawings. In the following embodiments, the present invention is specified as a semiconductor device containing an IGBT having N-channel MOS and PNP transistors. The following descriptions are applied as well to a semiconductor device including an IGBT having P-channel MOS and NPN transistors by reversing a conductivity type of each impurity region. In the embodiments below, a semiconductor device including a vertical IGBT having an emitter electrode and a collector electrode formed on different surfaces is described.

First Embodiment

Figure 1:
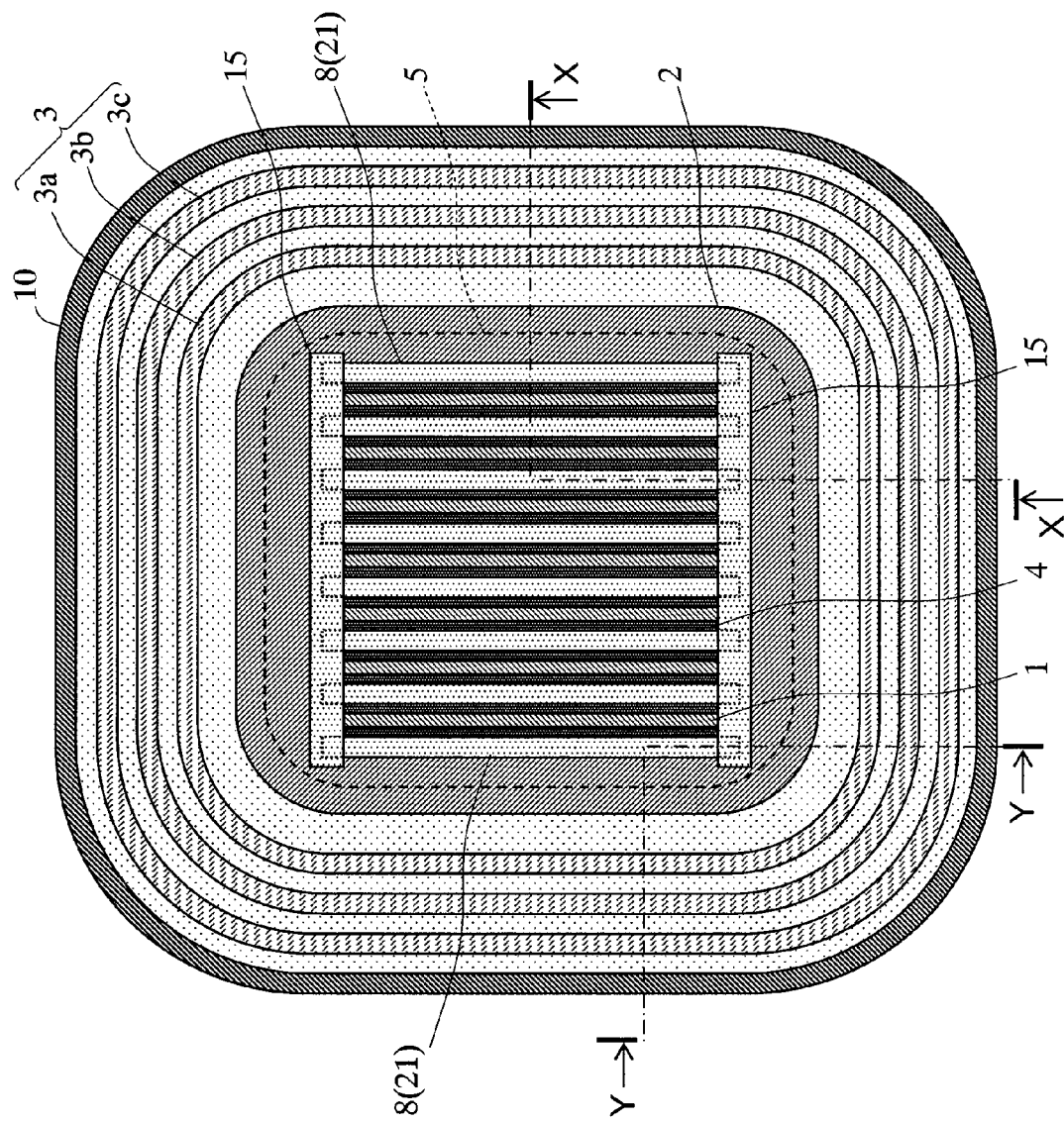
FIG. 1 is a plane view showing a semiconductor device in accordance with First Embodiment of the present invention.
Figure 2:
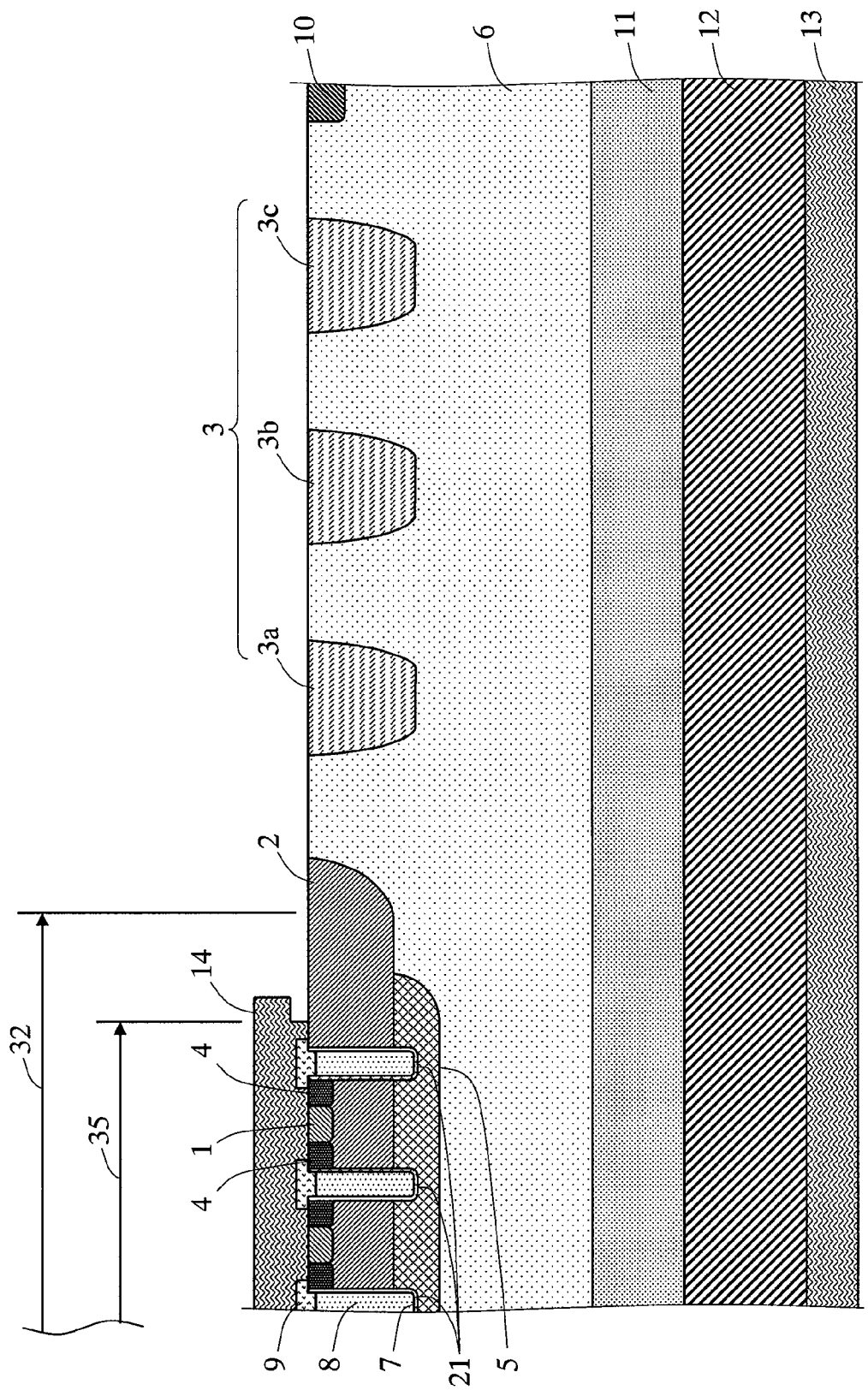
FIG. 2 is a cross-sectional view showing a semiconductor device in accordance with First Embodiment of the present invention.
Figure 3:
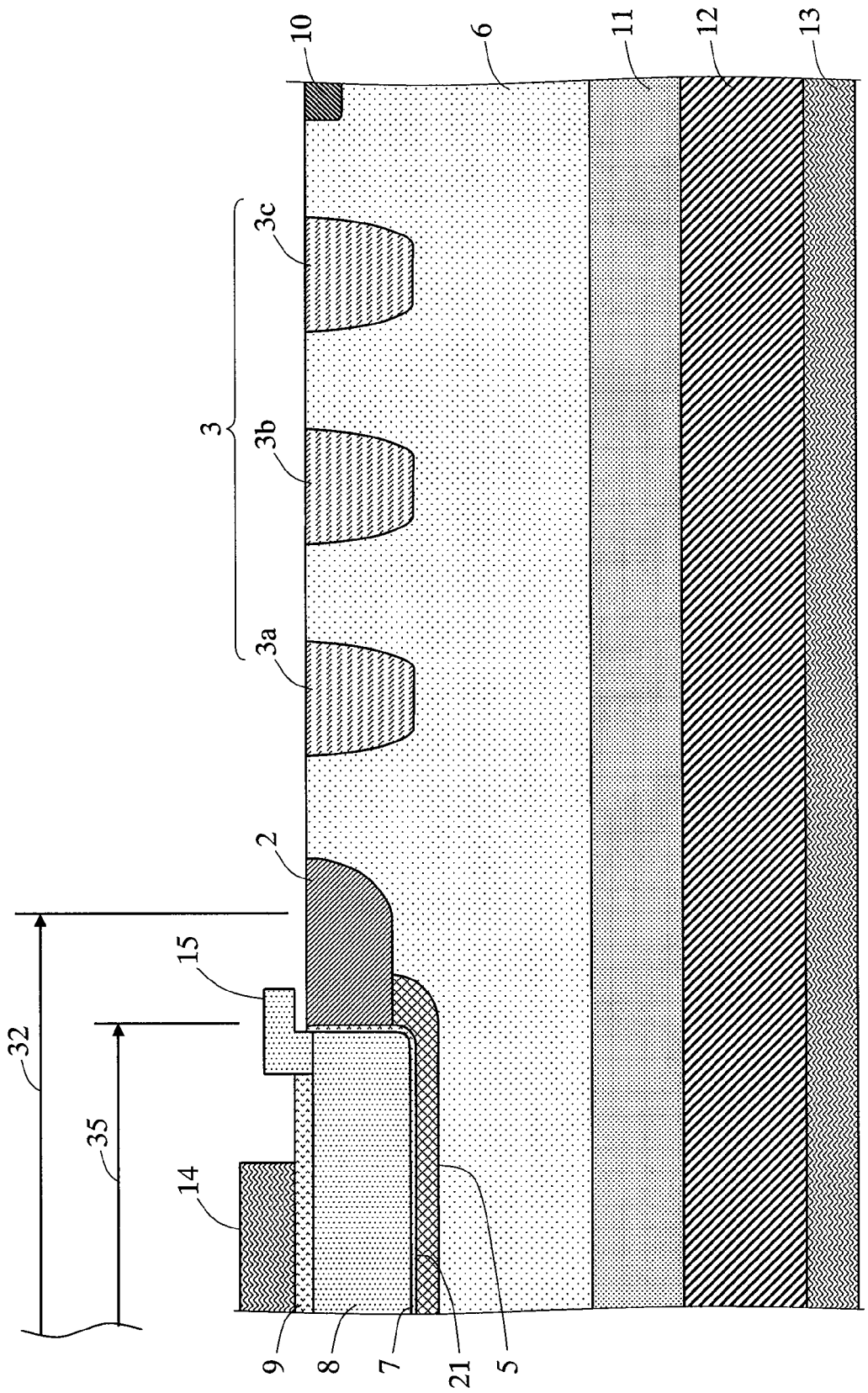
FIG. 3 is a cross-sectional view showing a semiconductor device in accordance with First Embodiment of the present invention.

FIG. 1 is a plane view showing the structure of a semiconductor device in accordance with the first embodiment of the present invention. FIG. 2 is a cross-sectional view taken along a line X-X in FIG. 1, and FIG. 3 is a cross-sectional taken along a line Y-Y in FIG. 1. FIGS. 1 to 3 are schematic views and the components are not shown in their actual scale ratios.

As shown in FIGS. 2 and 3, the semiconductor device in the present embodiment is provided with an N⁻ layer 6 (a first semiconductor layer) consisting of a low concentration N-type impurity region. A collector layer 12 consisting of a high concentration P-type impurity region is provided below the N⁻ layer 6 with a buffer layer 11 consisting of a high concentration N-type impurity region interposed therebetween. A collector electrode 13 is provided on the underside of the collector layer 12.

On the other hand, a body layer 2 (a second semiconductor layer) consisting of a P-type impurity region is provided in the upper part of the N⁻ layer 6. A plurality of trenches 21 (trench formed regions) is formed through the body layer 2 from the main surface thereof at specific intervals. Each trench 21 is filled with a gate electrode 8 made of, for example, polysilicon and the like via a gate insulating film 7 such as an oxide film and the like formed on the inner surface of the each trench 21. As shown in FIG. 1, the each gate electrode 8 (trench 21) is continuously formed in a direction perpendicular to the sheet of FIG. 2.

As shown in FIGS. 1 and 2, emitter layers 4 each consisting of a high concentration N-type impurity region are formed on the main surface of the body layer 2 along and in contact with the trenches 21. Contact layers 1 each consisting of a high concentration P-type impurity region are formed in the middle of the emitter layer 4 between adjacent trenches 21 along the trenches 21.

Furthermore, the IGBT shown in FIGS. 1 to 3 has an emitter electrode 14 provided on the top surfaces of the emitter layers 4 and contact layers 1 and making electric connection to both of them. The gate electrodes 8 and emitter electrode 14 are electrically insulated as oxide films 9 are interposed between the each gate electrode 8 and the emitter electrode 14. In the plane view of FIG. 1, the emitter electrode 14 is omitted. As shown in FIGS. 1 and 3, the gate electrodes 8 are electrically connected to each other via coupling electrodes 15.

On the other hand, as shown in FIGS. 1 to 3, a plurality of floating ring layers 3 (third semiconductor layers) each consisting of a high concentration P-type impurity region is provided around the body layer 2 in which the trenches 21 are formed, being spaced apart from the body layer 2. In this embodiment, three floating ring layers 3a, 3b, and 3c having the same width are disposed at equal intervals in plane view. A channel stopper layer 10 consisting of a high concentration N-type impurity region is provided around the outermost floating ring layer 3c, being spaced apart from the floating ring layer 3c. The floating ring layers 3 locate an edge of a main surface of a depletion layer extending along the contour of the body layer 2 away form the body layer 2 when a reverse voltage is applied between the collector and the emitter. The floating ring layers 3 serve to reduce the curvature of the edge of the depletion layer so as to prevent the breakdown due to electric field concentration. Each floating ring layer 3 is electrically floating. A given potential is applied to the channel stopper layer 10 to prevent the depletion layer from extending beyond the region of the IGBT element.

As shown in FIGS. 1 to 3, the semiconductor device of this embodiment has a well layer 5 (a fourth semiconductor layer) inside the body layer 2 in plane view with the bottom positioned deeper than bottom of the body layer 2. The well layer 5 consists of an N-type impurity region and forms a PN junction at the interface with the body layer 2. The well layer 5 has an impurity concentration lower than the body layer 2 and higher than the N⁻ layer 6. The well layer 5 can be formed for example by ion-implantation of N-type impurities in a portion 35 within an ion-implanting portion 32 for forming the body layer 2 in plane view.

Figure 4:
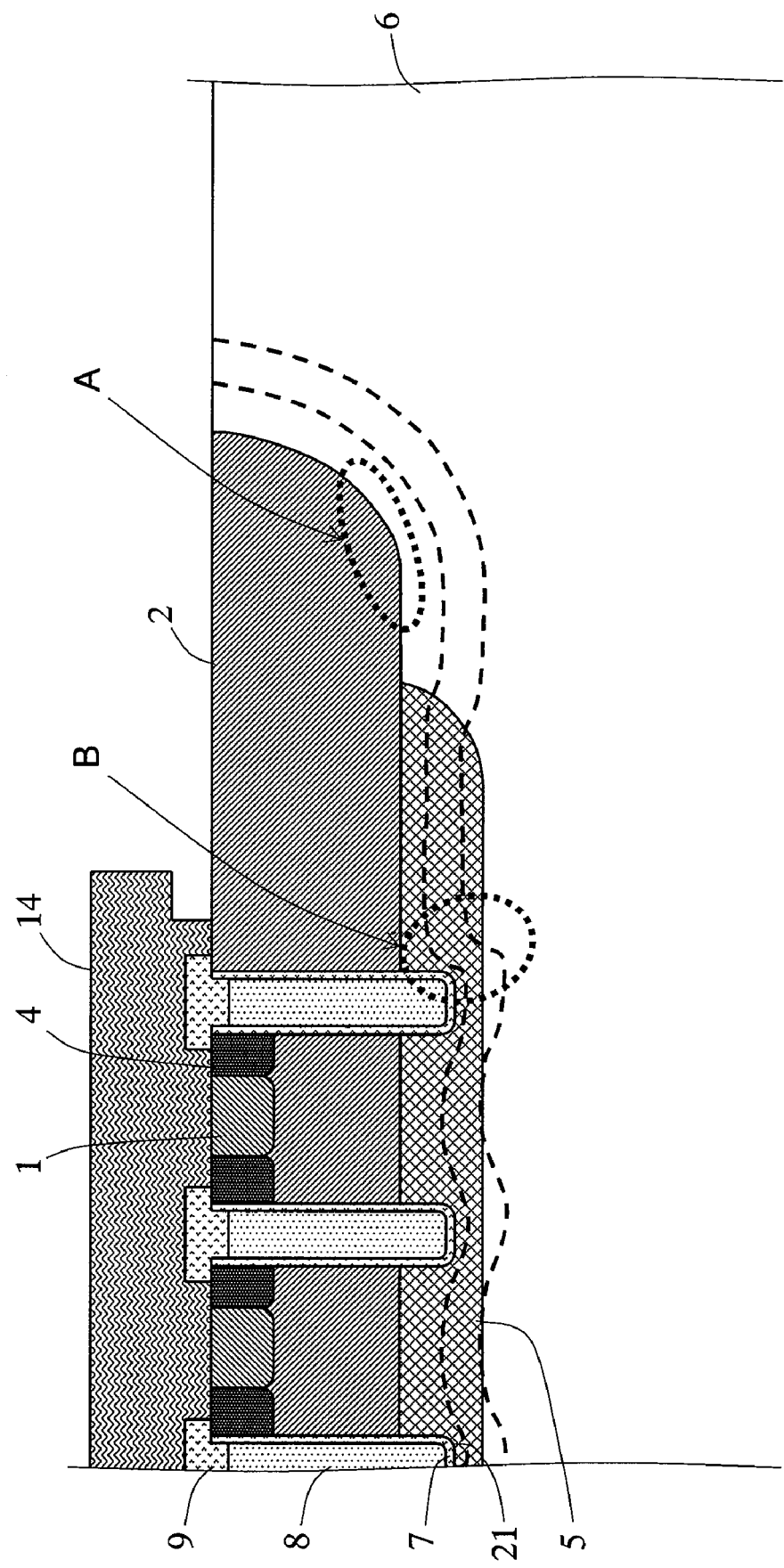
FIG. 4 is a cross-sectional view showing a potential distribution in a semiconductor device in accordance with First Embodiment of the present invention.

FIG. 4 is a cross-sectional view schematically showing the potential distribution when a specific reverse voltage is applied to the collector electrode 13 in the gate-off state. Equipotential lines are shown by broken lines in FIG. 4. Here, a specific positive voltage is applied to the collector electrode 13 while 0 V is applied to the gate electrode 8 and emitter electrode 14.

In the semiconductor device of this embodiment, the well layer 5 is absent around the bottom corner of the body layer 2 (marked by an arrow A in FIG. 4) where breakdown initially occurs in the conventional IGBT structure. In other words, the P-type body layer 2 and N-type N⁻ layer 6 form a PN junction around the bottom corner of the body layer 2 in the semiconductor device of this embodiment. As described above, the N⁻ layer 6 has a lower impurity concentration than the well layer 5. Therefore, when a reverse voltage is applied to the collector electrode in the gate-off state, the depletion layer has a larger width around the bottom corner of the body layer 2 as compared to the conventional structure. As a result, the PN junction around the bottom corner of the body layer 2 has an improved PN junction breakdown voltage, preventing cut-down in the collector-emitter breakdown voltage (BVCES).

As described above, the absence of the well layer 5 around the bottom corner of the body layer 2 can reduce the on-resistance without lowering the collector-emitter breakdown voltage (BVCES).

Figure 5:
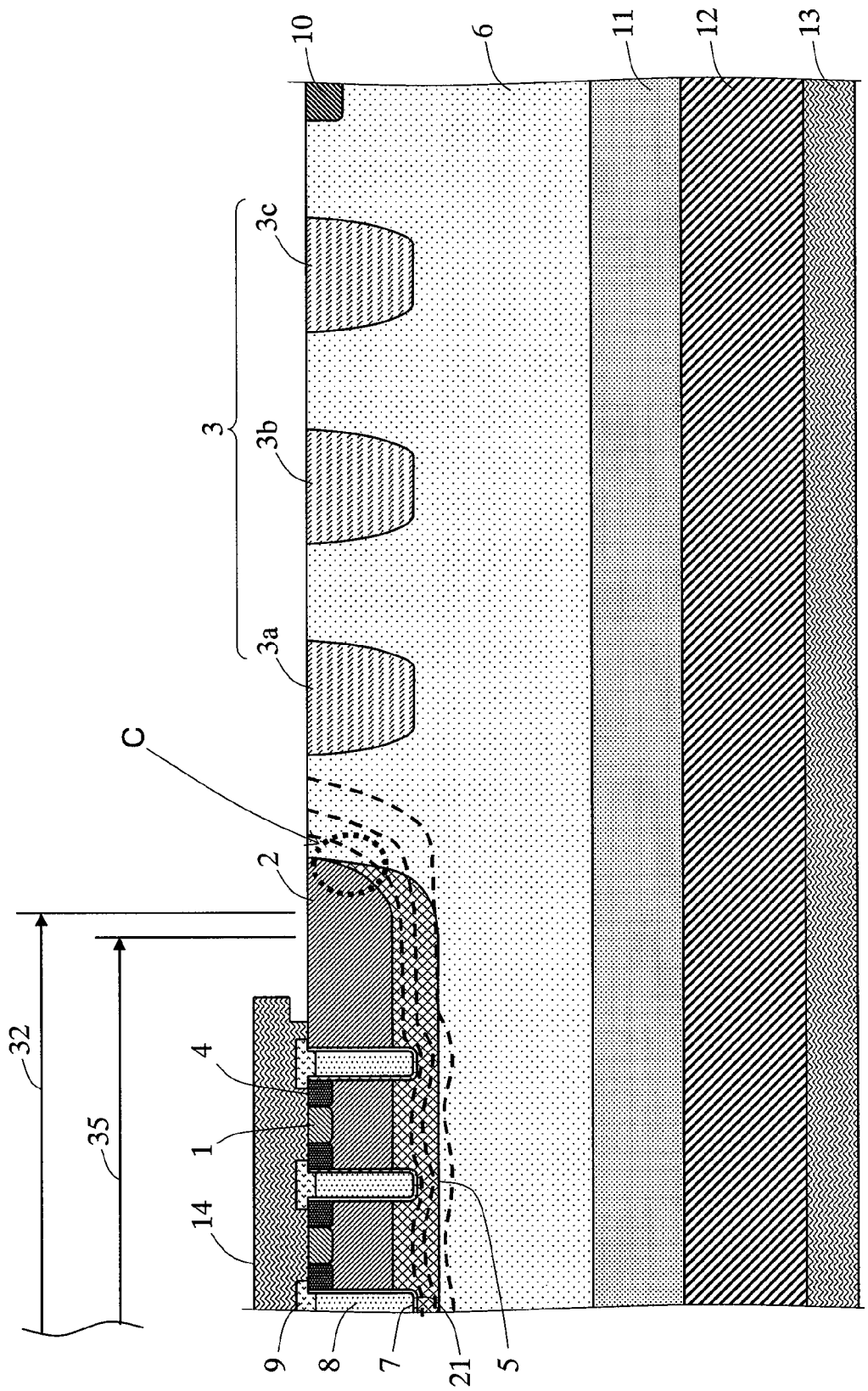
FIG. 5 is a plane view showing a modification of a semiconductor device in accordance with First Embodiment of the present invention.

The edges of the body layer 2 and well layer 5 can nearly coincide with each other as long as the well layer 5 is contained in the body layer 2. FIG. 5 is a cross-sectional view showing a modification of the semiconductor device of the present embodiment. The cross-sectional structures in FIGS. 2 and 5 are different in the edge position of the well layer 5 in the main surface.

As shown in FIG. 5, the well layer 5 overlaps with the body layer 2 more in this modification than in FIG. 2 so that the well layer 5 surrounds the body layer 2 in the cross-sectional structure. Also in this structure, the ion-implanting portion 35 for forming the well layer 5 is contained in the ion-implanting portion 32 for forming the body layer 2. The N-type impurities ion-implanted for forming the well layer 5 diffuse horizontally and consequently form the well layer 5 containing the body layer 2. In such a cross-sectional structure, the well layer 5 has a lower impurity concentration at the PN junction on the side of the body layer 2 (marked by an arrow C in FIG. 5) than at the PN junction around the bottom corner of the body layer 2.

When a reverse voltage is applied to the collector electrode 13 in the gate-off state, the depletion layer in the PN junction on the side of the body layer 2 has a larger width in the structure shown in FIG. 5 than in the conventional structure. The wider depletion layer in the PN junction on the side of the body layer 2 results in reducing the curvature of equipotential lines at the PN junction around the bottom corner of the body layer 2 and alleviates the electric field concentration at the PN junction around the bottom corner of the body layer 2 as compared to in the conventional structure. Thus, the structure shown in FIG. 5 also improves the PN junction breakdown voltage around the bottom corner of the body layer 2 and prevents cut-down in the collector-emitter breakdown voltage (BVCES). In other words, the well layer 5 formed between the body layer 2 and the N⁻ layer 6 within the body layer 2 in plane view serves to prevent cut-down in the collector-emitter breakdown voltage (BVCES).

As described above, this embodiment can reduce the on-resistance without lowering the collector-emitter breakdown voltage (BVCES) of the IGBT. As a result, the distance between the body layer and the channel stopper layer can be reduced for the same on-resistance, thereby downsizing the chip.

In FIGS. 2 and 5, the collector-emitter breakdown voltage (BVCES) can be increased as the distance between the edges of the ion-implanting portion 35 for forming the well layer 5 and the ion-implanting portion 32 for forming the body layer 2 in plane view is increased.

Second Embodiment

The structure in which the well layer is contained in the body layer in plane view is described in the first embodiment. In the structure of the first embodiment, when the impurity concentration of the well layer is increased to reduce the on-resistance, the electric field concentrates around the corner below the outermost trench formed region (see the region marked by an arrow B in FIG. 4). Therefore, when a reverse voltage is applied to the collector electrode in the gate-off state, breakdown initially occurs around the corner below the outermost trench. If the impurity concentration of the well layer is increased, the breakdown voltage is lowered and consequently the collector-emitter breakdown voltage (BVCES) is lowered. Then, a semiconductor device allowing for a high concentration well layer compared to the first embodiment is described in the second embodiment of the present invention.

Figure 6:
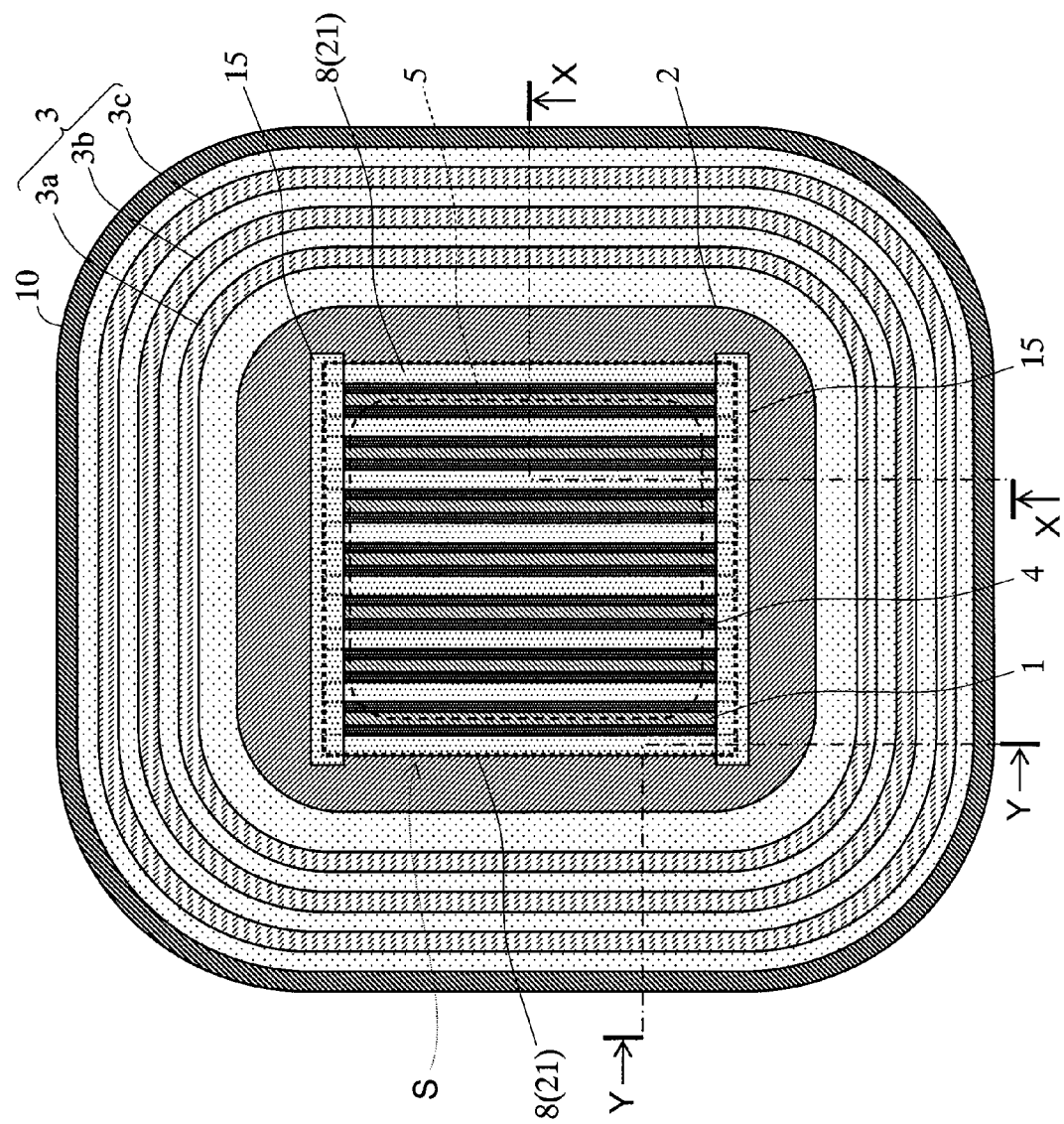
FIG. 6 is a plane view showing a semiconductor device in accordance with Second Embodiment of the present invention.
Figure 7:
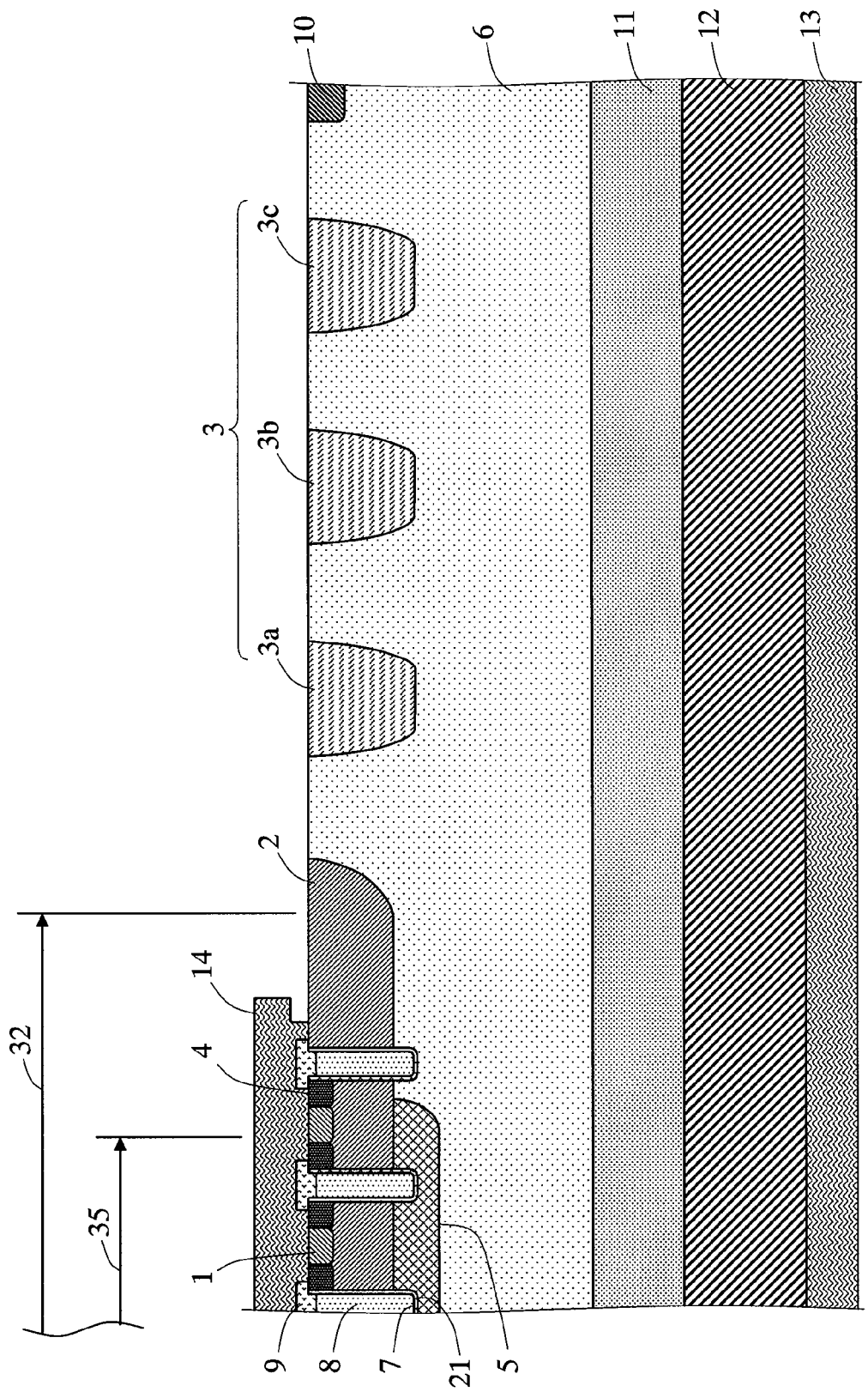
FIG. 7 is a cross-sectional view showing a semiconductor device in accordance with Second Embodiment of the present invention.
Figure 8:
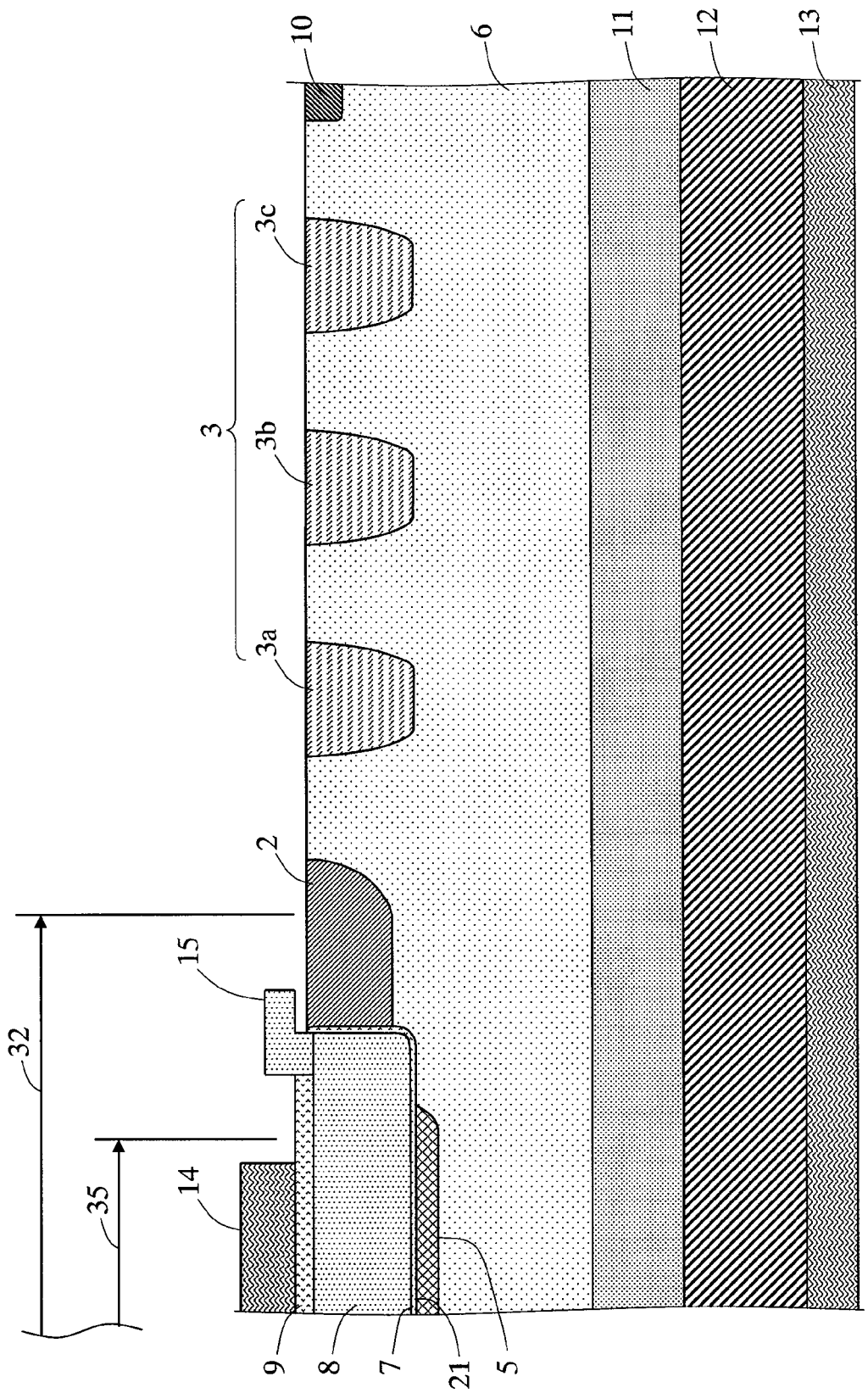
FIG. 8 is a cross-sectional view showing a semiconductor device in accordance with Second Embodiment of the present invention.

FIG. 6 is a plane view showing the structure of a semiconductor device according to the second embodiment of the present invention. FIG. 7 is a cross-sectional view showing the cross-sectional structure at a line X-X in FIG. 6. FIG. 8 is a cross-sectional view showing the cross-sectional structure at a line Y-Y in FIG. 6. FIGS. 6 to 8 are schematic views and the components are not shown in their actual scale ratios. In FIGS. 6 to 8, the same components as those of the semiconductor device of the first Embodiment are referred to by the same reference numbers.

As shown in FIGS. 6 to 8, in the semiconductor device of the present embodiment, the well layer 5 is formed inside the outermost edge of multiple trenches 21 in plane view. In other words, the well layer 5 is formed within an area S defined by the edges of the outermost trenches and containing all trenches 21. In FIG. 6, the outermost edges S of multiple trenches 21 are shown by the dotted lines.

As in the first embodiment, the well layer 5 consists of an N-type impurity region. The well layer 5 has an impurity concentration lower than the body layer 2 and higher than the N⁻ layer 6. For example, the well layer 5 can be formed by ion-implantation of N-type impurities in a portion 35 contained in an ion-implanting region 32 for forming the body layer 2.

The other structures of this semiconductor device are the same as of the semiconductor device of the first embodiment and their explanation is omitted here.

Figure 9:
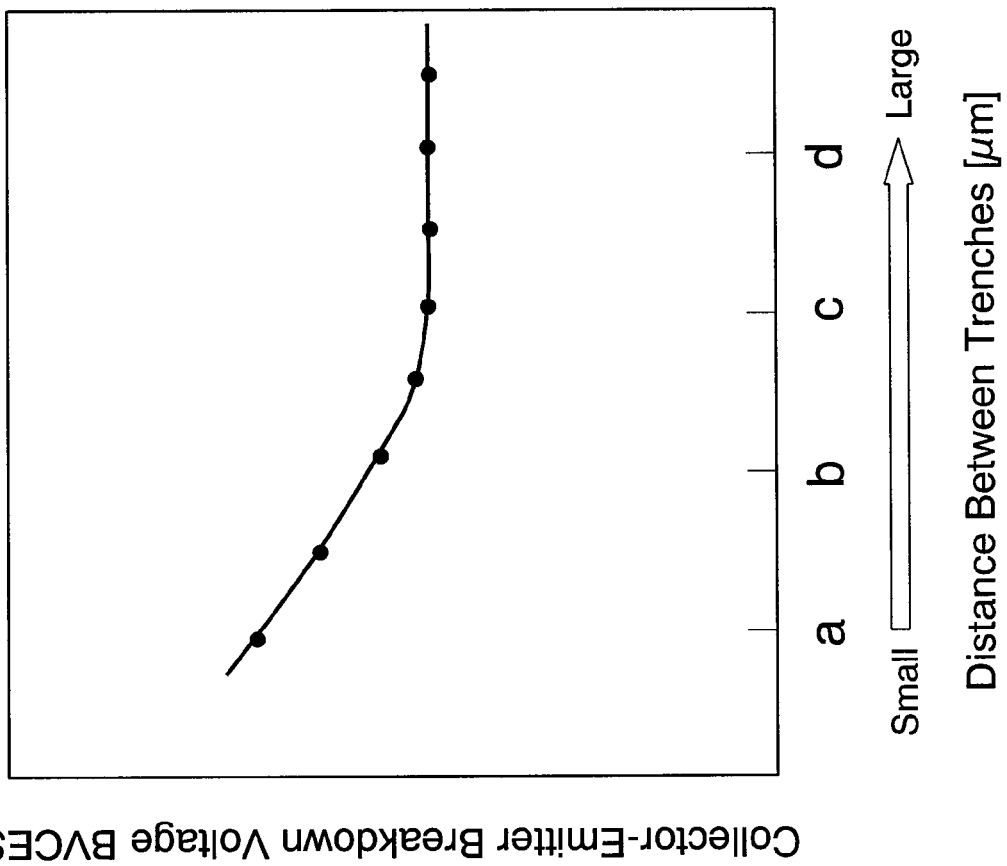
FIG. 9 is a graphical representation showing a relationship between the distance between trenches and the collector-emitter breakdown voltage.

FIG. 9 is a graphical representation showing a relationship between the distance between adjacent trenches 21 and the collector-emitter breakdown voltage (BVCES). In FIG. 9, the distance between trenches is in a horizontal axis and the collector-emitter breakdown voltage (BVCES) is in a vertical axis.

It is understood from FIG. 9 that the collector-emitter breakdown voltage (BVCES) is gradually increased as the distance between trenches 21 is decreased. This is because when the distance between trenches 21 is small, the depletion layer extending from each trench 21 to the well layer 5 does not follow the contour of the trench 21. The depletion layer follows the contour of each trench 21 as the distance between trenches 21 is increased. In other words, when the distance between trenches 21 is small, the total quantity of N-type impurities in the well layer 5 present between adjacent trenches 21 is small. Therefore, because of the interaction between the depletion layer extending to the well layer 5 at the PN junction comprised of the body layer 2 and the well layer 5 and the depletion layer extending from the trenches 21 to the well layer 5, the deeper edge of the depletion layer is present away from the body layer 2. On the other hand, when the distance between trenches 21 is large, the total quantity of N-type impurities in the well layer 5 present between adjacent trenches 21 is large. Therefore, the depletion layer follows the contours of the trenches 21 and body layer 2.

Then, the edge of the depletion layer approaches the trenches 21 as the distance between adjacent trenches 21 is increased. The electric field in the edge of the depletion layer is intensified as the edge approaches the trenches 21. Consequently, the collector-emitter breakdown voltage (BVCES) is lowered. The outermost trench 21 has an adjacent trench 21 on one side and no adjacent trench on the other side. In other words, the outermost trench 21 is at an infinitely large distance from the adjacent trench 21 on the other side. Therefore, the collector emitter breakdown voltage (BVCES) falls under the range in which it is saturated for the change in the distance between trenches 21 in FIG. 9 (the range in which the BVCES is small). More specifically, the electric field concentrates around the corner of the outermost trench 21 on the side where no adjacent trench 21 is present.

Figure 10:
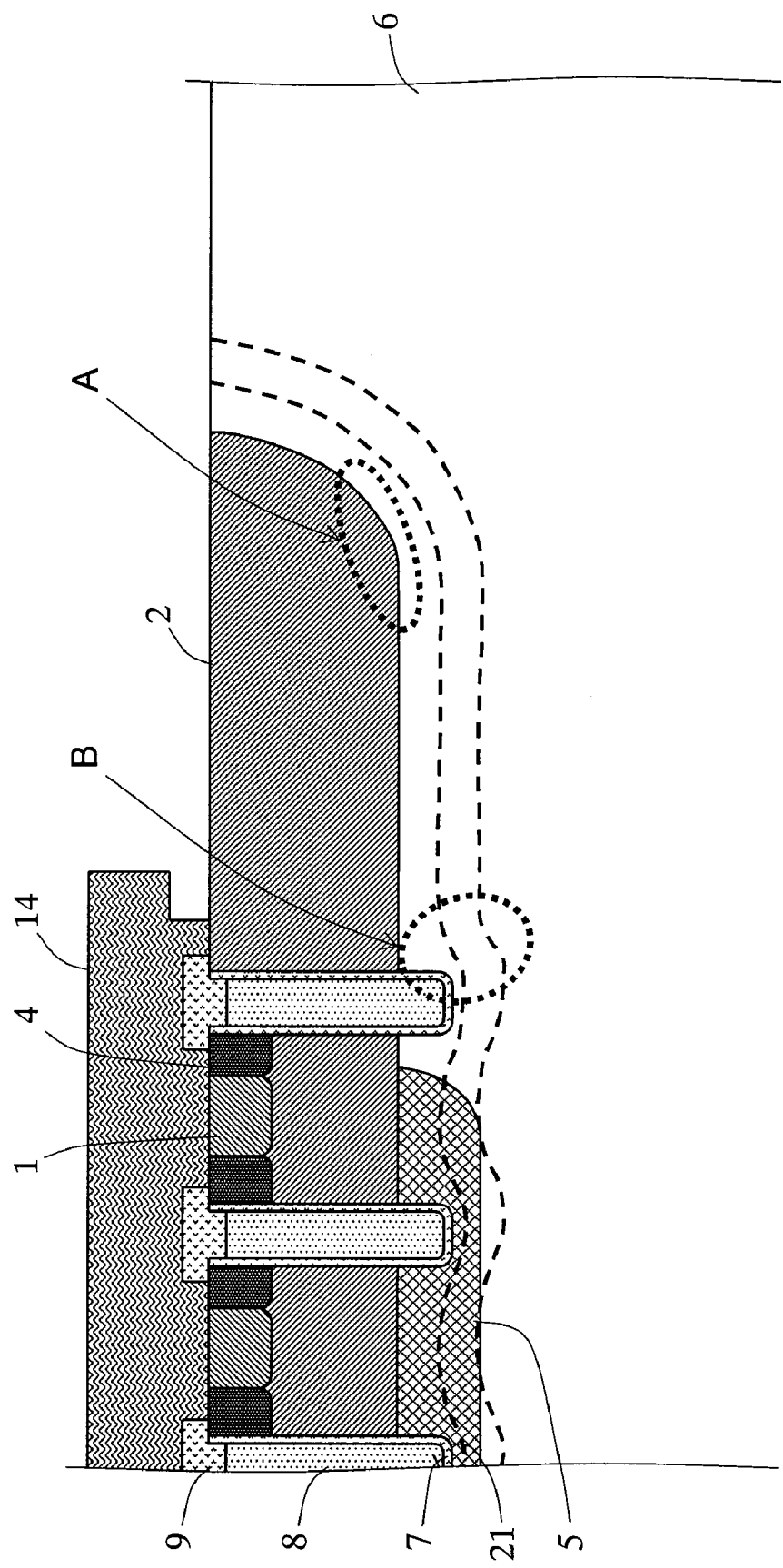
FIG. 10 is a cross-sectional view showing a potential distribution in a semiconductor device in accordance with Second Embodiment of the present invention.

FIG. 10 is a cross-sectional view showing the potential distribution when the same reverse voltage as in FIG. 4 is applied to the collector electrode 13 in the gate-off state. Equipotential lines are shown by broken lines in FIG. 10.

The well layer 5 is absent around the outermost trench 21 in the semiconductor device of the present embodiment. The equipotential lines have a smaller curvature around the corner of the outermost trench 21 in FIG. 10 compared to in FIG. 4 (see the region marked by an arrow B in FIG. 10). In the structure of this embodiment, the electric field strength at the bottom of the outermost trench is lowered to improve the breakdown voltage. As a result, the collector-emitter breakdown voltage (BVCES) is not lowered even if the impurity concentration of the well layer 5 is increased.

As described above, this embodiment can prevent cut-down in the collector-emitter breakdown voltage (BVCES) even if the impurity concentration of the well layer is increased to reduce the on-resistance. Consequently, the distance between the body layer and the channel stopper layer can be reduced for the same on-resistance, thereby downsizing the chip.

Third Embodiment

Figure 11:
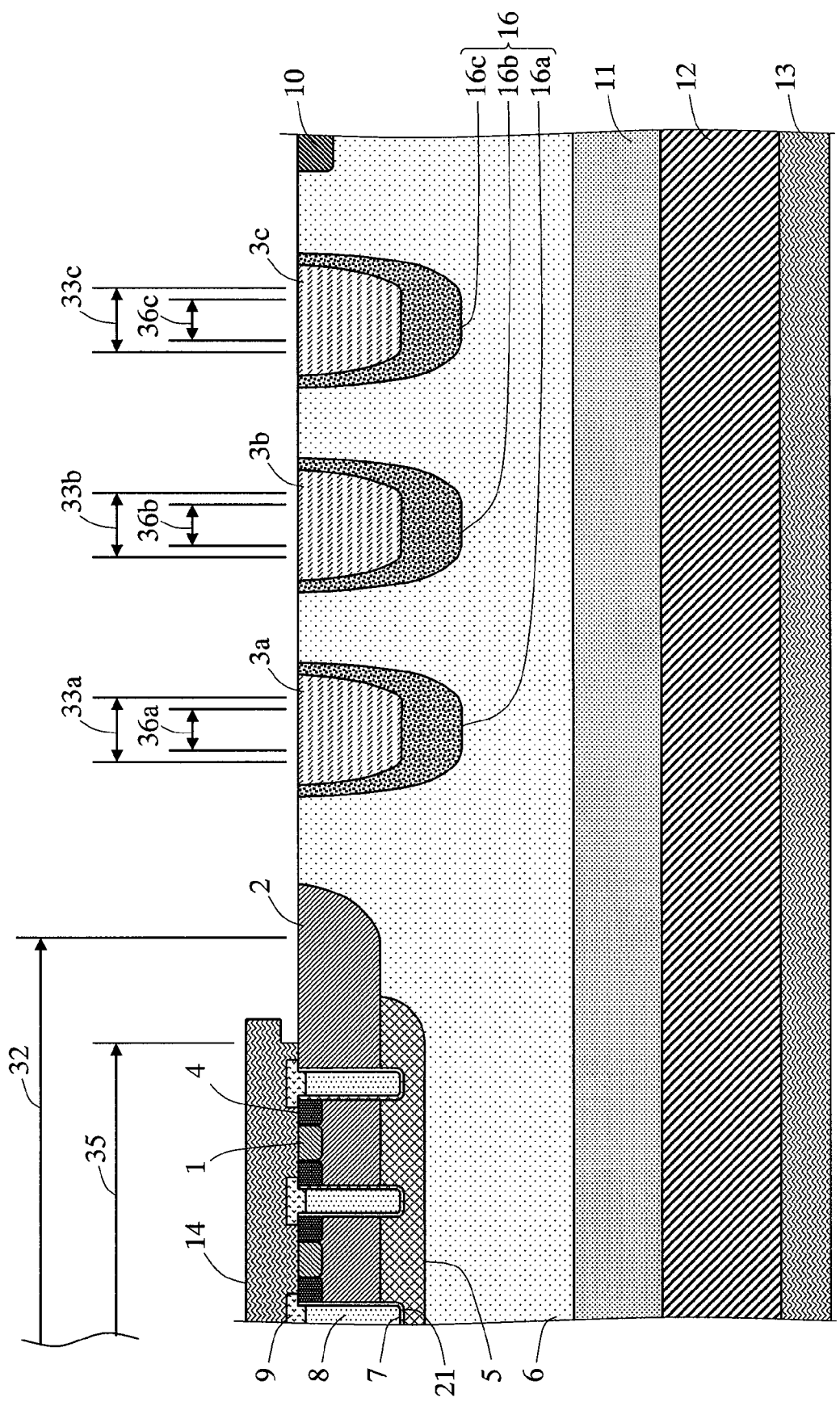
FIG. 11 is a cross-sectional view showing a semiconductor device in accordance with Third Embodiment of the present invention.

The third embodiment of the present invention is described hereafter. FIG. 11 is a cross-sectional view showing a structure of a semiconductor device in this embodiment. The semiconductor device of this embodiment has the same planar structure as that shown in the plane view of FIG. 1 except for the structure around the floating ring layers. FIG. 11 corresponds to the cross-sectional structure at the line X-X in FIG. 1. FIG. 11 is a schematic view and the components are not shown in their actual scale ratios. In FIG. 11, the same components as those of the semiconductor device in the first embodiment are referred to by the same reference numbers.

As shown in FIG. 11, the semiconductor device of this embodiment comprises second well layers 16 (fifth semiconductor layers) each containing a floating ring layer 3 in addition to the structure explained in the first embodiment. More specifically, the second well layers 16 (16a, 16b 16c) have bottoms positioned deeper than the bottoms the floating ring layer 3 and respectively contain the floating ring layers 3 (3a, 3b, 3c) in plane view. The second well layers 16 are N-type impurity regions, and have an impurity concentration lower than the floating ring layers 3 and higher than the N⁻ layer 6. For example, as shown in FIG. 11, the second well layers 16 are formed ion-implantation of N-type impurities in portions 36 (36a, 36b, 36c) contained in ion-implanting portions 33 (33a, 33b, 33c) for forming each floating ring layer 3a, 3b, 3c. Then, the N-type impurities ion-implanted for forming the second well layers 16 diffuse horizontally and consequently form the second well layers 16 containing the floating ring layers 3, respectively.

In the structure of this embodiment, the N-type second well layers 16 having a higher impurity concentration than the N⁻ layer 6 are disposed in surface portions between the body layer 2 and the channel stopper layer 10. In this structure, when a reverse voltage is applied to the collector electrode 13 in the gate-off state, the depletion layer extends in the body layer 2 and well layer 5 from the PN junction comprised of the body layer 2 and the well layer 5 as the collector voltage is increased. Then, when the collector voltage is further increased, the depletion layer having extended thorough the well layer 5 extends through the N⁻ layer 6 and reaches the second well layer 16a containing the floating ring layer 3a before it reaches the innermost floating ring layer 3a. As described above, the second well layer 16a has a higher impurity concentration than the N⁻ layer 6. Therefore, the depletion layer extends at a lower rate in the second well layer 16a than in the N⁻ layer 6 (see the equation 2). Then, the edge of the depletion layer reaches the floating ring layer 3a when a higher collector voltage is applied compared to the conventional structure. Having reached the floating ring layer 3a, the depletion layer passes through the floating ring layer 3a and again extends through the second well layer 16a and then the N⁻ layer 6 between the floating ring layer 3a and the next floating ring layer 3b. When the edge of the depletion layer reaches the floating ring layers 3b and 3c, the depletion layer extends at a lower rate because of the second well layers 16b and 16c compared to the conventional structure.

Therefore, when a specific collector voltage is applied, the edge of the depletion layer locates closer to the body layer 2 as compared to the conventional structure. Therefore, in this structure, the second well layer 16 serves to reduce the distance between the body layer 2 and the channel stopper layer 10 as compared to the conventional structure. Further, the second well layers 16 are formed only around the floating ring layers 3, thereby that does not affect the structure around the body layer 2 (the structure to reduce the on-resistance without lowering the emitter-collector breakdown voltage). As a result, according to this structure, a chip can be downsized without changing the on-resistance and collector-emitter breakdown voltage.

Figure 12:
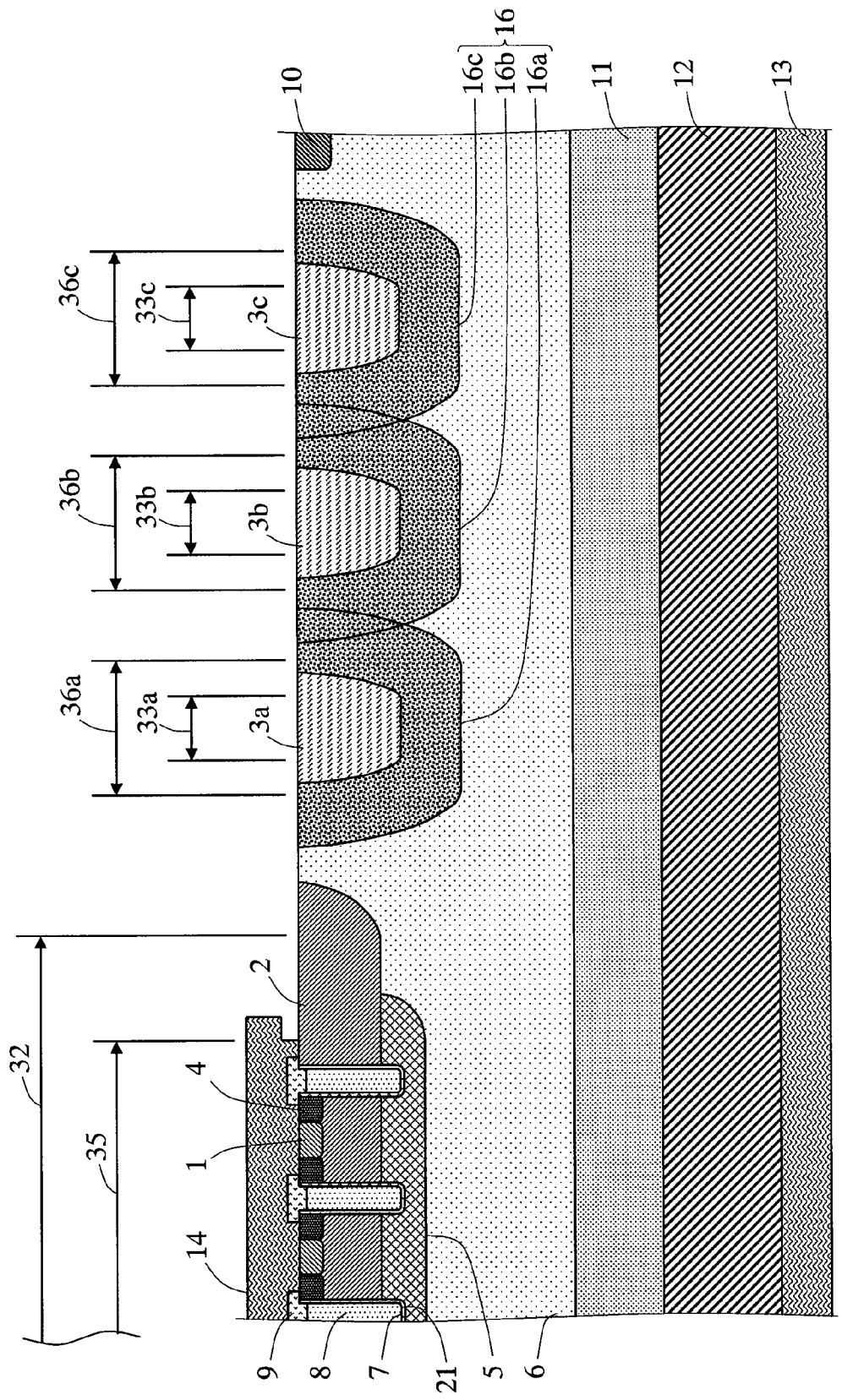
FIG. 12 is a cross-sectional view showing a modification of a semiconductor device in accordance with Third Embodiment of the present invention.

Incidentally, in this embodiment shown in FIG. 11, the second wells 16 are respectively formed around the floating ring layers 3a to 3c spaced apart one another. However, it is not essential to dispose each second well layer 16a, 16b, 16c spaced apart. FIG. 12 is a cross-sectional view showing a modification of a semiconductor device of the present embodiment. As in FIGS. 11 and 12 is a cross-sectional view taken along the line X-X in FIG. 1. FIG. 12 is a schematic view and the components are not shown in their actual scale ratios. In FIG. 12, the same components as those of the semiconductor device in the first embodiment are referred to by the same reference numbers.

As shown in FIG. 12, in this modification, the second well layers 16 (16a to 16c) respectively contain floating ring layers 3 (3a to 3c) and have the bottoms deeper than the bottoms of the floating ring layers 3. The second well layers 16 are N-type impurity regions. The second well layers 16 have an impurity concentration lower than the floating ring layers 3 and higher than the N⁻ layer 6. In the structure shown in FIG. 12, the second well layers 16 can be formed for example by ion-implantation of N-type impurities in portions 36 (36a, 36b, 36c) containing ion-implanting portions 33 (33a, 33b, 33c) for forming the floating ring layers 3.

In this structure, the N-type second well layers 16 having a higher impurity concentration than the N⁻ layer 6 are provided in surface portions between the body layer 2 and the channel stopper layer 10 more extensively than in the structure shown in FIG. 11. Thus, the impurity concentration of the N-type region from the body layer 2 to the channel stopper layer 10 is higher than in the structure shown in FIG. 11, thereby the depletion layer extends at a lower rate. In this structure, the distance between the body layer 2 and the channel stopper layer 10 can further be reduced as compared to the structure shown in FIG. 11.

Figure 13:
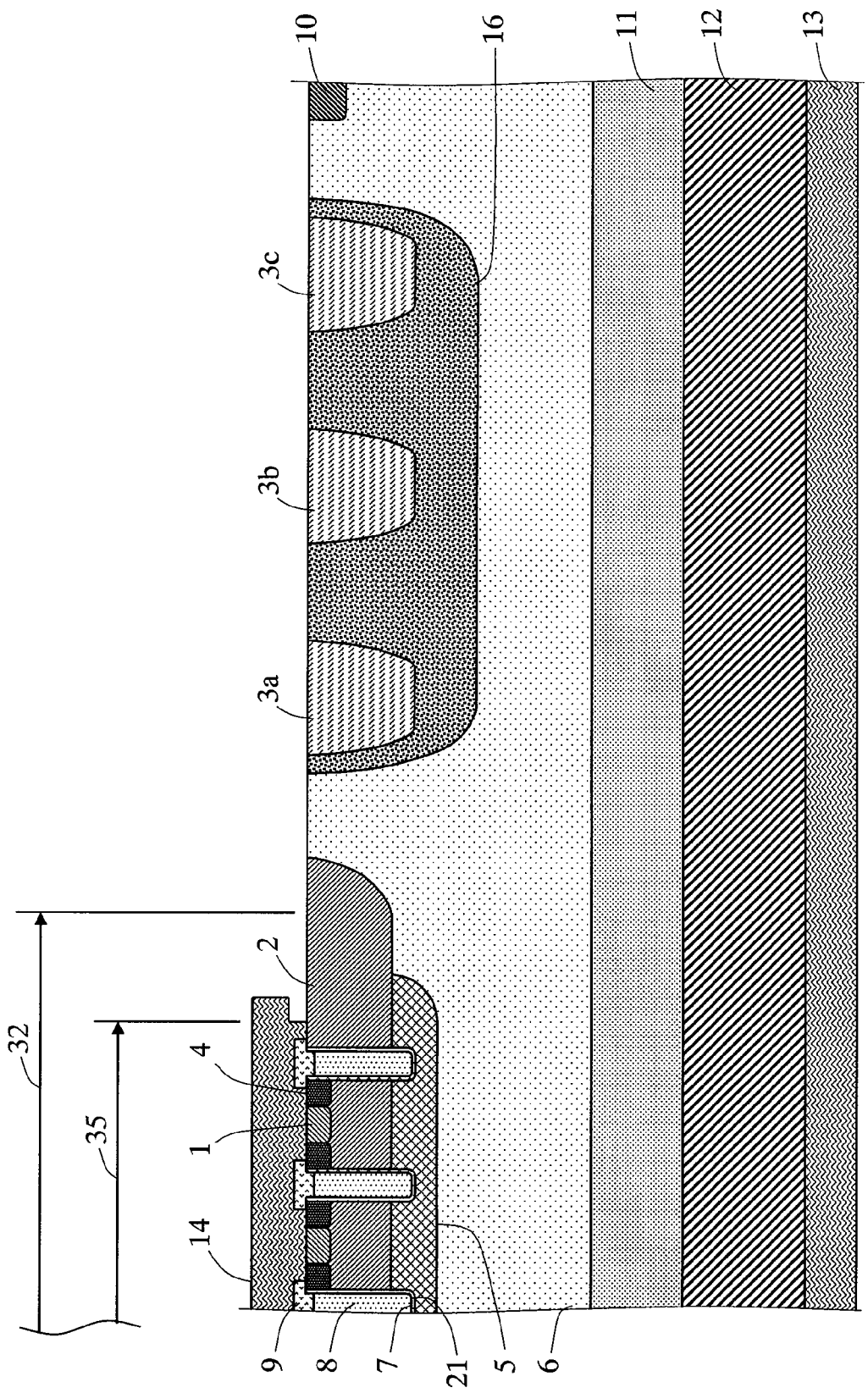
FIG. 13 is a cross-sectional view showing a modification of a semiconductor device in accordance with Third Embodiment of the present invention.

The present embodiment is described with regard to the structure described in the first embodiment. However, the structure of this embodiment can be applied to the structure described in the second embodiment. In the above modification, the second well layers are each formed as an individual impurity region. However, it is not essential to form each of them as an individual impurity region. The second well layer 16 can be formed as a single impurity region as shown in FIG. 13.

Fourth Embodiment

In the third embodiment, the structure to reduce the extension of the depletion layer equally in each of the floating ring layers is described. However, in view of reducing the curvature of the contour of the depletion layer edge, it is preferable that the depletion layer extends less as it is away from the body layer. Then, preferable positioning of the second well layers is described in the fourth embodiment of the present invention.

Figure 14:
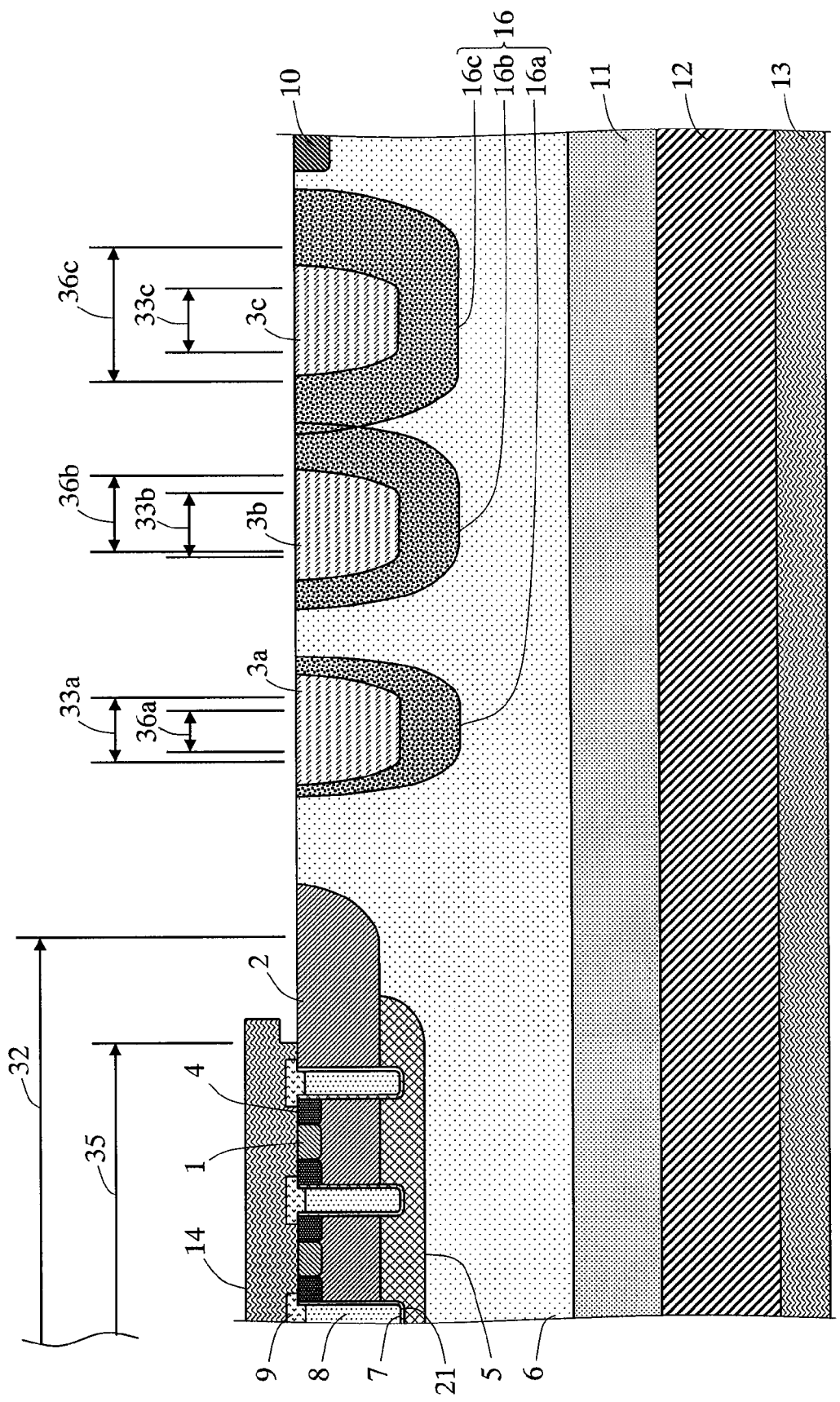
FIG. 14 is a cross-sectional view showing a semiconductor device in accordance with Fourth Embodiment of the present invention.
Figure 15:
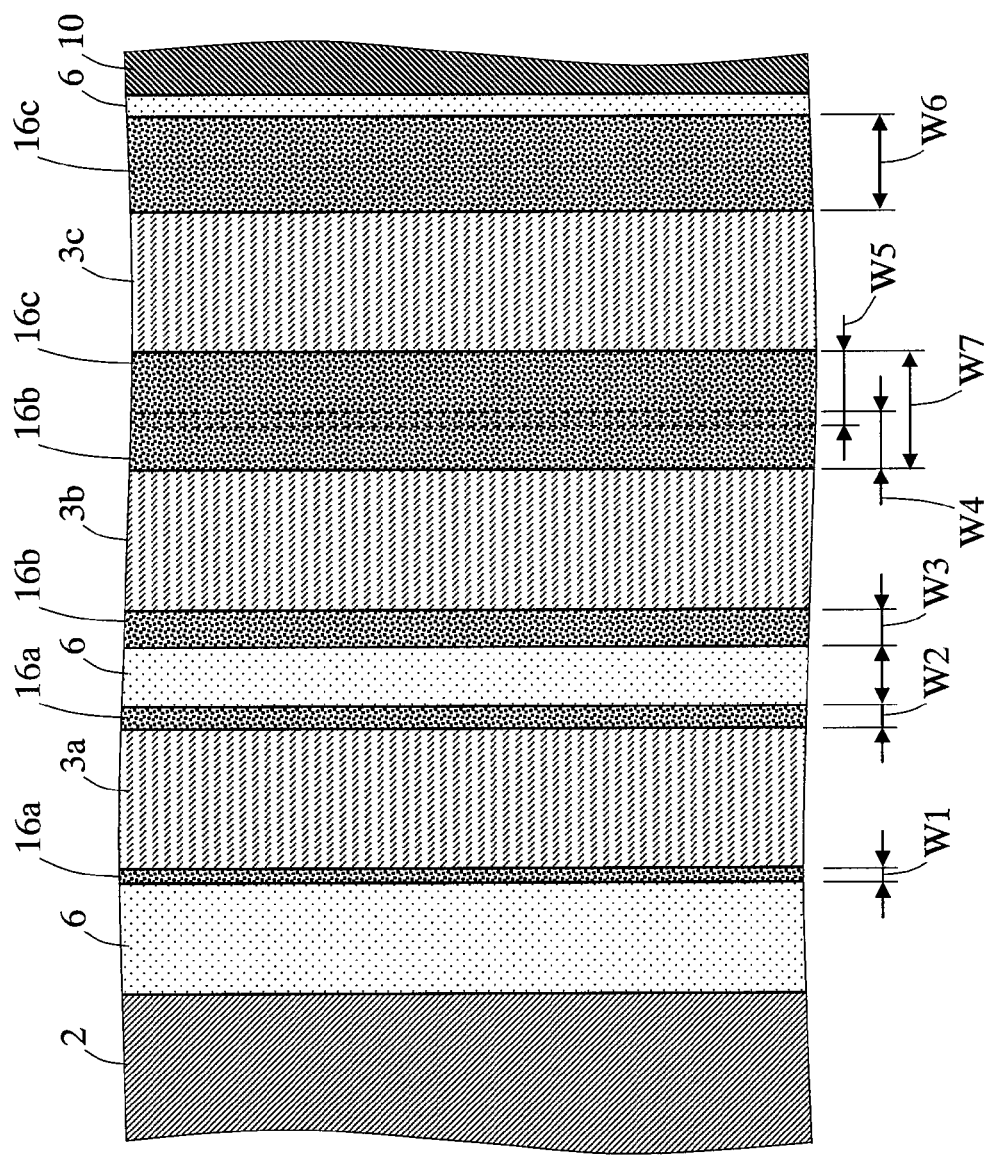
FIG. 15 is an enlarged plane view showing a semiconductor device in accordance with Fourth Embodiment of the present invention.
Figure 16:
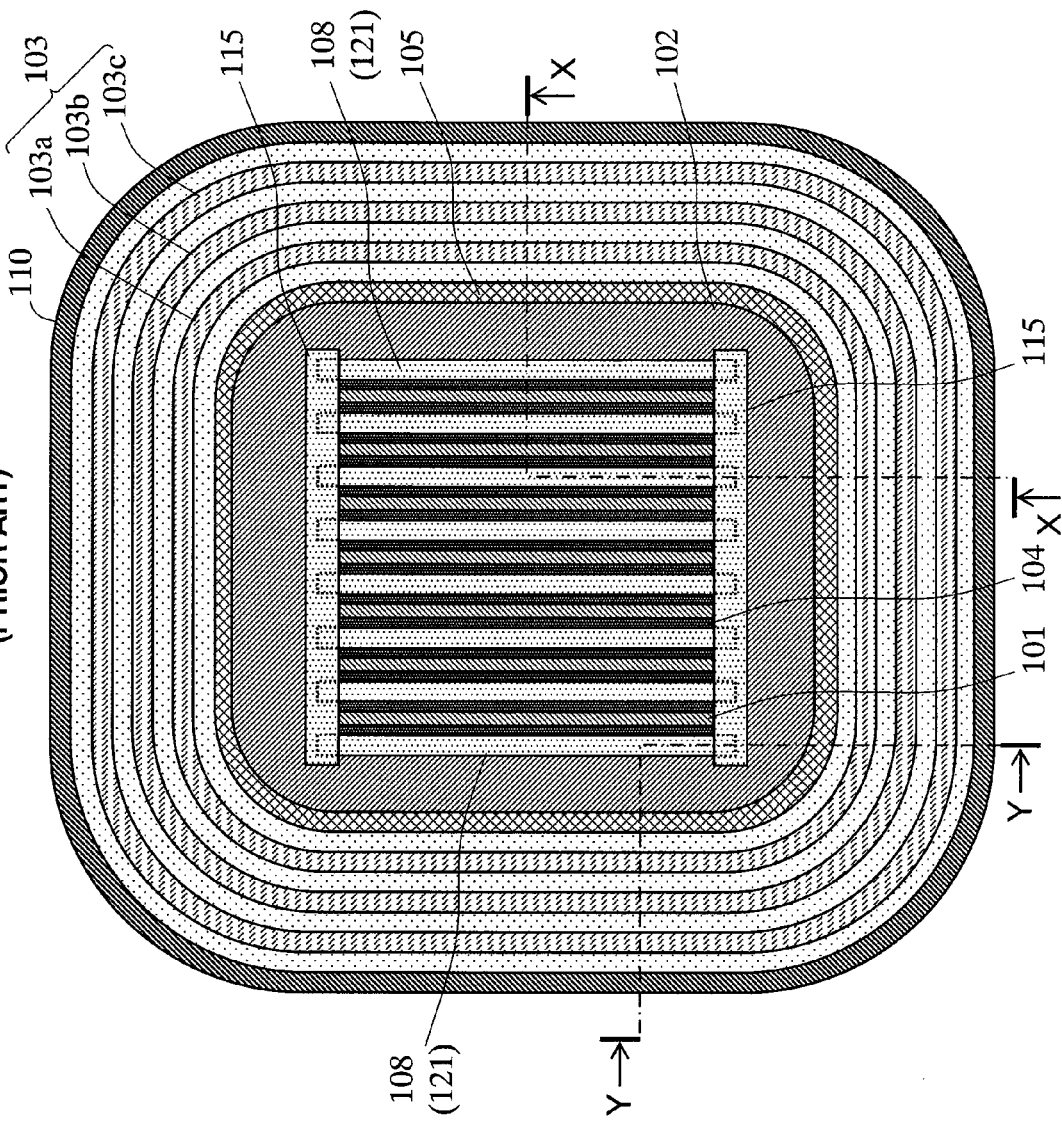
FIG. 16 is a plane view showing a conventional semiconductor device.
Figure 17:
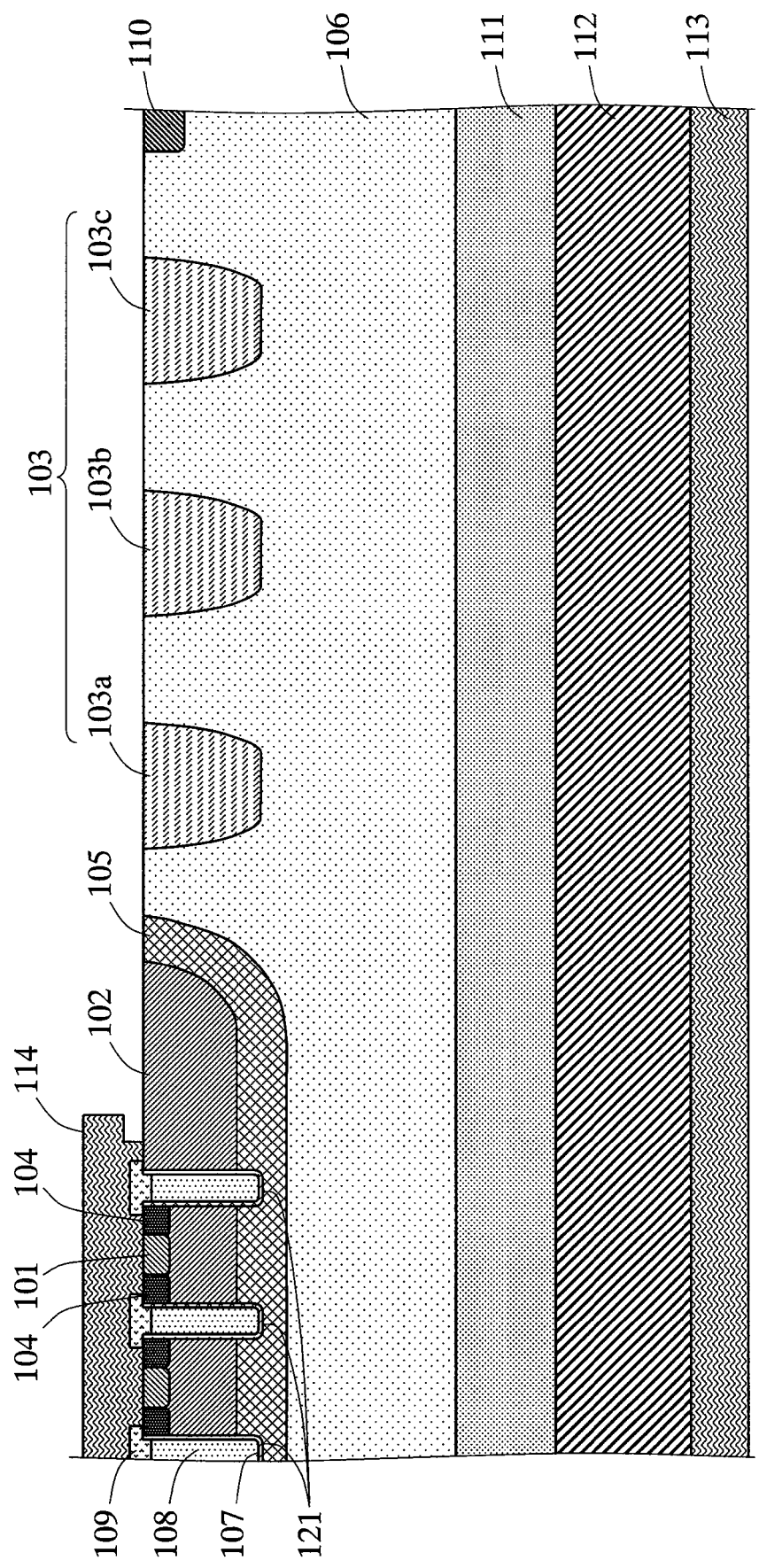
FIG. 17 is a cross-sectional view showing a conventional semiconductor device.
Figure 18:
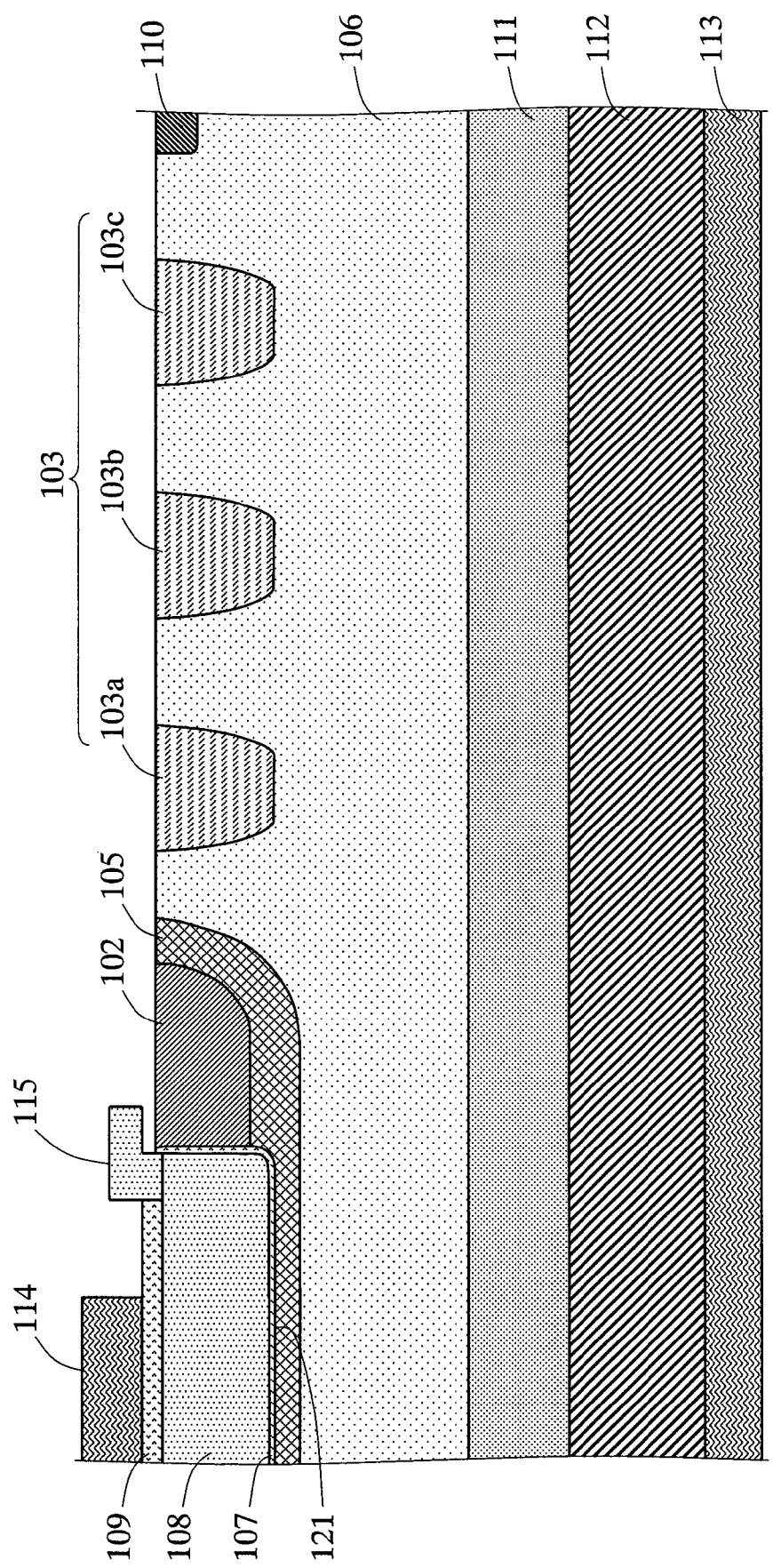
FIG. 18 is a cross-sectional view showing a conventional semiconductor device.
Figure 19:
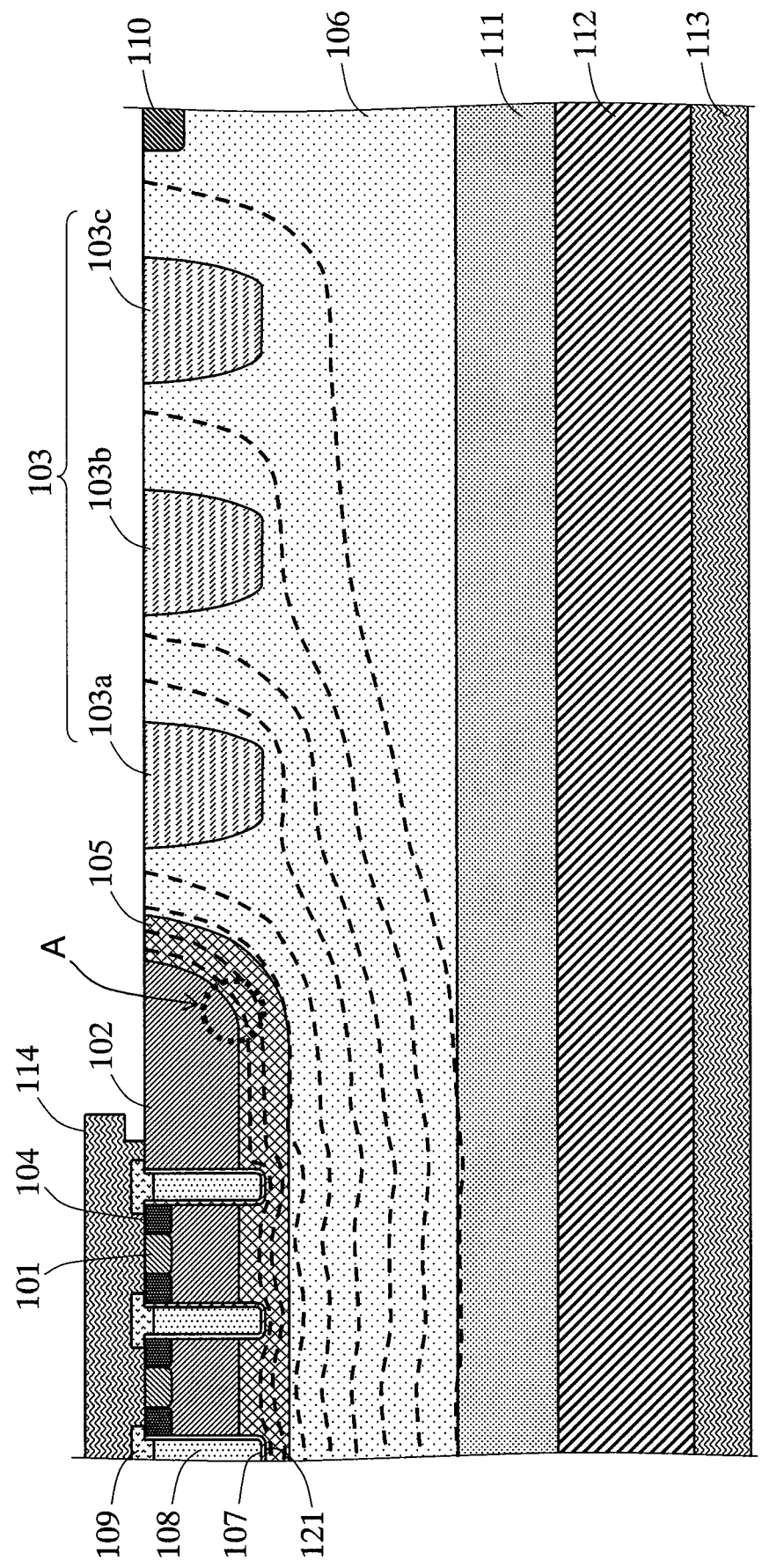
FIG. 19 is a cross-sectional view showing a potential distribution in a conventional semiconductor device.

FIG. 14 is a cross-sectional view of a semiconductor device in this embodiment. The semiconductor device of this embodiment has the same planar structure as that in the plane view of FIG. 1 except for the structure around each floating ring layer. FIG. 14 corresponds to the cross-sectional structure at the line X-X in FIG. 1. FIG. 14 is a schematic view and the components are not shown in their actual scale rates. FIG. 15 is a plane view showing the region shown in FIG. 14. In FIGS. 14 and 15, the same components as those in the first embodiment are referred to by the same reference numbers.

As in the semiconductor device of the third embodiment, the semiconductor device of this embodiment comprises the second well layers 16 (16a to 16c) containing each floating ring layer 3 (3a to 3c). The second well layers 16 are N-type impurity region, and have an impurity concentration lower than the floating ring layers 3 and higher than the N⁻ layer 6. In this embodiment, as shown in FIGS. 14 and 15, the second well layers 16a to 16c are present on the sides of the floating ring layers 3a to 3c, having a width larger on the side away from the body layer 2 than on the side closer to the body layer 2 in plane view. In other words, a width W2 of the second well layer 16a on the side of the floating ring layer 3a which is away from the body layer 2 is larger than a width W1 of another second well layer 16a which is closer to the body layer 2. A width W4 of the second well layer 16b on the side of the floating ring layer 3b which is away from the body layer 2 is larger than a width W3 of another second well layer 16b which is closer to the body layer 2. A width W6 of the second well layer 16c on the side of the floating ring layer 3c which is away from the body layer 2 is larger than a width W5 of another second well layer 16c which is closer to the body layer 2.

Additionally, in this embodiment, at least one of the widths (W1, W2, W3, W7, and W6 from the body layer 2 side) of the second well layers 16 present on the sides of each floating ring layer 3a, 3b, 3c is larger than the widths of other inner second well layers 16 in plane view. Here, particularly, the second well layers 16 are formed in the manner that each width of the second well layers 16 present on the sides of each floating ring layers 3a, 3b, 3c is increased from the body layer 2 side (W1<W2<W3<W7).

The second well layers 16 as described above can be formed, for example, by ion-implantation of N-type impurities in a portion 36a contained in an ion-implanting portion 33a for forming the floating ring layer 3a, a portion 36b partly containing an ion-implanting portion 33b for forming the floating ring layer 3b, and a portion 36c containing in an ion-implanting portion 33c for forming the floating ring layer 3c. The center lines of the portions 36a, 36b, and 36c are shifted toward the channel stopper layer 10 from the center lines of the portions 33a, 33b, and 33c, respectively.

In the structure of this embodiment, the N-type second well layers 16 having a higher impurity concentration than the N– layer 6 are disposed in surface portions between the body layer 2 and the channel stopper layer 10. In addition, the width of each second well layer 16 present on the sides of each floating ring layer 3a, 3b, 3c is increased in order from the body layer 2 (W1<W2<W3<W7).

When a reverse voltage is applied to the collector electrode 13 in the gate-off state, the electric field strength in a PN junction comprised of the floating ring layer 3 and the second well layer 16 is higher in a PN junction closer to the body layer 2 than in a PN junction away from the body layer 2. For example, the electric field strength in the PN junction comprised of the floating ring layer 3a and the second well layer 16a is higher than the electric field strength in the PN junction comprised of the floating ring layer 3b and the second well layer 16b.

When a pair of the second well layers 16 on both sides of respective floating ring layers 3 is disposed in a state that the second well layer width on the side away from the body layer 2 is larger than the second well layer width on the side closer to the body layer 2 in plane view, the N-type impurity concentration on the side closer to the body layer 2 is lower than the N-type impurity concentration on the side away from the body layer 2. Namely, the N-type impurity concentration can be lowered on the side where electric field strength is higher. Further, when the second well layers 16 are disposed in a state that the second well layer width on either side of one floating ring layer 3 closer to the body layer 2 is smaller than the second well layer width on either side of another floating ring layer 3 away from the body layer 2 in plane view, the N-type impurity concentration can be lowered in the region where the electric field strength is higher.

Therefore, disposing the second well layers 16 as described above serve to effectively ease the electric field strength in the PN junctions of the floating ring layers 3 with higher electric field strength closer to the body layer 2. As a result, the collector-emitter breakdown voltage in the gate-off state can be improved. Namely, the distance between the body layer 2 and the channel stopper layer 10 can be reduced for the same collector-emitter breakdown voltage, thereby downsizing the chip.

In this embodiment, two structures are simultaneously used. Namely, one is that the each second well layer has the smaller width on the body layer side than the other side in respective floating ring layers 3, in plane view, and the other is that the second well layer closer to the body layer has a smaller width than the second well layer away from the body layer in other different floating ring layers. However, it is not necessarily essential to combine those two structures. Only one structure can be used. Even when only one of these structures is used, the collector-emitter breakdown voltage can be improved and the chip can be downsized as compared to the third embodiment.

The present embodiment is described with regard to the structure described in the first embodiment. However, the structure of this embodiment can be applied to the structure described in the second embodiment. Furthermore, in this embodiment, all floating ring layers are provided with the second well layers, however, not all floating ring layers may be provided with the second well layers.

As described above, the present invention can reduce the on-resistance without lowering the collector-emitter breakdown voltage of the insulated gate bipolar transistor. Namely, the collector-emitter breakdown voltage can be improved for the same on-resistance. And, the distance between the body layer and the channel stopper layer can be reduced for the same on-resistance, thereby downsizing the chip. Further, providing the second well layer containing the floating ring layer allows the distance between the body layer and the channel stopper layer can further be reduced, consequently further downsizing the chip.

The above embodiments are described by way of example and do not restrict the present invention. Various modifications and applications are available without departing from the technical idea of the present invention. For example, the trenches are arranged in parallel in plane view in the above embodiments. However, the trenches can be arranged in any way. The body layer and floating ring layers can be formed in the same process of forming impurity regions at the same time in the above embodiments. The well layers and the second well layers also can be formed in the same process of forming impurity regions at the same time. In any case, a number of masks used for manufacturing a semiconductor device and a number of manufacturing process steps of a semiconductor device can be reduced, thereby production costs are decreased.

The present invention can downsize the chip while maintaining the on-resistance and breakdown voltage and be useful as a semiconductor device including an insulated gate bipolar transistor.

What is claimed is:

1. A semiconductor device including an insulated gate bipolar transistor, comprising:
   a first semiconductor layer of a first conductivity type impurity region;
   a second semiconductor layer of a second conductivity type impurity region formed on the first semiconductor layer;
   a plurality of trench formed regions formed through the second semiconductor layer from the main surface thereof;
   a gate insulating film and a gate electrode formed within the respective trench formed regions;

a contact layer of the second conductivity type impurity region formed on the main surface of the second semiconductor layer;

an emitter layer of the first conductivity type impurity region formed on the main surface of the second semiconductor layer;

a plurality of third semiconductor layers of the second conductivity type impurity region which is formed spaced apart from the second semiconductor layer on the main surface of the first semiconductor layer; and a fourth semiconductor layer of the first conductivity type impurity region formed between the second semiconductor layer and the first semiconductor layer within an area contained in the second semiconductor layer in plane view, formed only inside an edge of the second semiconductor layer in plane view, and formed continuously across a plurality of the trench formed regions.

2. A semiconductor device according to claim 1, wherein the fourth semiconductor layer is formed inside the outermost edge of the plurality of the trench formed regions in plane view.

3. A semiconductor device according to claim 1, further comprising:
a fifth semiconductor layer of the first conductivity type impurity region containing the third semiconductor layer,
wherein an impurity concentration of the fifth semiconductor layer is higher than that of the first semiconductor layer.

4. A semiconductor device according to claim 2, further comprising:
a fifth semiconductor layer of the first conductivity type impurity region containing the third semiconductor layer,
wherein an impurity concentration of the fifth semiconductor layer is higher than that of the first semiconductor layer.

5. A semiconductor device according to claim 3, wherein the fifth semiconductor layer is individually formed to the each third semiconductor layer.

6. A semiconductor device according to claim 4, wherein the fifth semiconductor layer is individually formed to the each third semiconductor layer.

7. A semiconductor device according to claim 5, wherein in plane view, a pair of the fifth semiconductor layers on both sides of the third semiconductor layer is disposed in a state that a width of the fifth semiconductor layer on the side away from the second semiconductor layer is larger than a width of the fifth semiconductor layer on the side closer to the second semiconductor layer.

8. A semiconductor device according to claim 6, wherein in plane view, a pair of the fifth semiconductor layers on both sides of the third semiconductor layer is disposed in a state that a width of the fifth semiconductor layer on the side away from the second semiconductor layer is larger than a width of the fifth semiconductor layer on the side closer to the second semiconductor layer.

9. A semiconductor device according to claim 3, wherein in plane view, a width of the fifth semiconductor layer on either side of one of the third semiconductor layers is larger than a width of fifth semiconductor layer on either side of another third semiconductor layer closer to the second semiconductor layer.

10. A semiconductor device according to claim 4, wherein in plane view, a width of the fifth semiconductor layer on either side of one of the third semiconductor layers is larger than a width of fifth semiconductor layer on either side of another third semiconductor layer closer to the second semiconductor layer.

11. A semiconductor device according to claim 5, wherein in plane view, a width of the fifth semiconductor layer on either side of one of the third semiconductor layers is larger than a width of fifth semiconductor layer on either side of another third semiconductor layer closer to the second semiconductor layer.

12. A semiconductor device according to claim 6, wherein in plane view, a width of the fifth semiconductor layer on either side of one of the third semiconductor layers is larger than a width of fifth semiconductor layer on either side of another third semiconductor layer closer to the second semiconductor layer.

13. A semiconductor device according to claim 7, wherein in plane view, a width of the fifth semiconductor layer on either side of one of the third semiconductor layers is larger than a width of fifth semiconductor layer on either side of another third semiconductor layer closer to the second semiconductor layer.

14. A semiconductor device according to claim 8, wherein in plane view, a width of the fifth semiconductor layer on either side of one of the third semiconductor layers is larger than a width of fifth semiconductor layer on either side of another third semiconductor layer closer to the second semiconductor layer.

15. A semiconductor device according to claim 1, wherein the second semiconductor layer and the third semiconductor layers are formed in the same process of forming impurity regions at the same time.

16. A semiconductor device according to claim 2, wherein the second semiconductor layer and the third semiconductor layers are formed in the same process of forming impurity regions at the same time.

17. A semiconductor device according to claim 3, wherein the fourth semiconductor layer and the fifth semiconductor layers are formed in the same process of forming impurity regions at the same time.

18. A semiconductor device according to claim 4, wherein the fourth semiconductor layer and the fifth semiconductor layers are formed in the same process of forming impurity regions at the same time.

* * * * *